United States Patent
Pisarenco et al.

(10) Patent No.: US 11,041,816 B2
(45) Date of Patent: Jun. 22, 2021

(54) METHODS AND APPARATUS FOR CALCULATING ELECTROMAGNETIC SCATTERING PROPERTIES OF A STRUCTURE AND FOR RECONSTRUCTION OF APPROXIMATE STRUCTURES

(71) Applicant: ASML Netherlands B.V., Veldhoven (NL)

(72) Inventors: Maxim Pisarenco, Son en Breugel (NL); Frank Stefan Schneider, Eindhoven (NL); Markus Gerardus Martinus Maria Van Kraaij, Eindhoven (NL); Martijn Constant Van Beurden, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 536 days.

(21) Appl. No.: 15/839,299

(22) Filed: Dec. 12, 2017

(65) Prior Publication Data

US 2018/0164229 A1 Jun. 14, 2018

(30) Foreign Application Priority Data

Dec. 13, 2016 (EP) ..................................... 16203869
Mar. 2, 2017 (EP) ..................................... 17158923

(51) Int. Cl.
*G01N 21/956* (2006.01)
*G03F 7/20* (2006.01)
*G01N 21/95* (2006.01)

(52) U.S. Cl.
CPC ... *G01N 21/95607* (2013.01); *G01N 21/9501* (2013.01); *G03F 7/705* (2013.01); *G03F 7/70625* (2013.01)

(58) Field of Classification Search
CPC .......... G01N 21/95607; G01N 21/9501; G03F 7/705; G03F 7/70625
See application file for complete search history.

(56) References Cited

U.S. PATENT DOCUMENTS 6,867,866 B1  3/2005  Chang et al.
7,038,850 B2  5/2006  Chang et al.
(Continued)

FOREIGN PATENT DOCUMENTS

EP          1 628 164 A2      2/2006
WO      WO 2015/032586  *   3/2015

OTHER PUBLICATIONS

International Search Report and Written Opinion of the International Searching Authority directed to related International Patent Application No. PCT/EO2017/080492, dated May 23, 2018; 9 pages.

(Continued)

*Primary Examiner* — Eunhee Kim
(74) *Attorney, Agent, or Firm* — Sterne, Kessler, Goldstein & Fox P.L.L.C.

(57) ABSTRACT

Disclosed is a method for reconstructing a parameter of a lithographic process. The method comprises the step of designing a preconditioner suitable for an input system comprising the difference of a first matrix and a second matrix, the first matrix being arranged to have a multi-level structure of at least three levels whereby at least two of said levels comprise a Toeplitz structure. One such preconditioner is a block-diagonal matrix comprising a BTTB structure generated from a matrix-valued inverse generating function. A second such preconditioner is determined from an approximate decomposition of said first matrix into one or more Kronecker products.

20 Claims, 9 Drawing Sheets

(56) References Cited

U.S. PATENT DOCUMENTS

| | | | |
|---|---|---|---|
| 8,645,109 B2 | 2/2014 | Dirks et al. | |
| 8,706,455 B2 | 4/2014 | Van Beurden et al. | |
| 2011/0098992 A1* | 4/2011 | Van Beurden | G03F 7/70625 703/2 |
| 2011/0218789 A1* | 9/2011 | Van Beurden | G03F 7/70625 703/13 |
| 2013/0066597 A1* | 3/2013 | Van Beurden | G03F 7/705 703/1 |
| 2016/0223916 A1* | 8/2016 | Van Beurden | G03F 7/705 |

OTHER PUBLICATIONS

Belachew, *Preconditioning Dense Complex Linear Systems from a VIM Discretization*, Aug. 2009, Technische Universitiet Eindhoven, Eindhoven, Netherlands; 93 pages.

Noutsos et al., "Block band Toeplitz preconditioners derived from generating function approximations: analysis and applications," *Numerische Mathematik*, Sep. 2006, vol. 104, Cham, Switzerland; pp. 339-376.

Van Beurden et al., "Local normal vector field formulation for periodic scattering problems formulated in the spectral domain," *Journal of the Optical Society of America A: Optics and Image Science*; Feb. 2017, vol. 34, No. 2, Optical Society of America, Washington, DC; pp. 224-233.

Lin et al., "BTTB preconditioners in BTTB systems," *Numerical Algorithms*, 2012, vol. 60, No. 1, Cham, Switzerland; pp. 153-167.

Kamm et al., "Optimal Kronecker product approximation of block Toeplitz matrices," *SIAM Journal on Matrix Analysis and Application*, 2000, vol. 22, No. 1, Society for Industrial and Applied Mathematics, Philadelphia, PA; pp. 155-172.

Chan et al., "Toeplitz preconditioners for Hermitian Toeplitz Systems," *Linear Algebra and its Applications*, 1993, vol. 190, Amsterdam, Netherlands; pp. 181-208.

Van Loan et al., "Approximation with Kronecker products," *Linear Algebra for Large Scale and Real-Time Applications*, 1993, New York, NY; pp. 293-314.

Olshevsky et al., "Tensor properties of multilevel Toeplitz and related matrices," *Linear Algebra and its Applications*, 2006, vol. 412, Amsterdam, Netherlands; pp. 1-21.

* cited by examiner

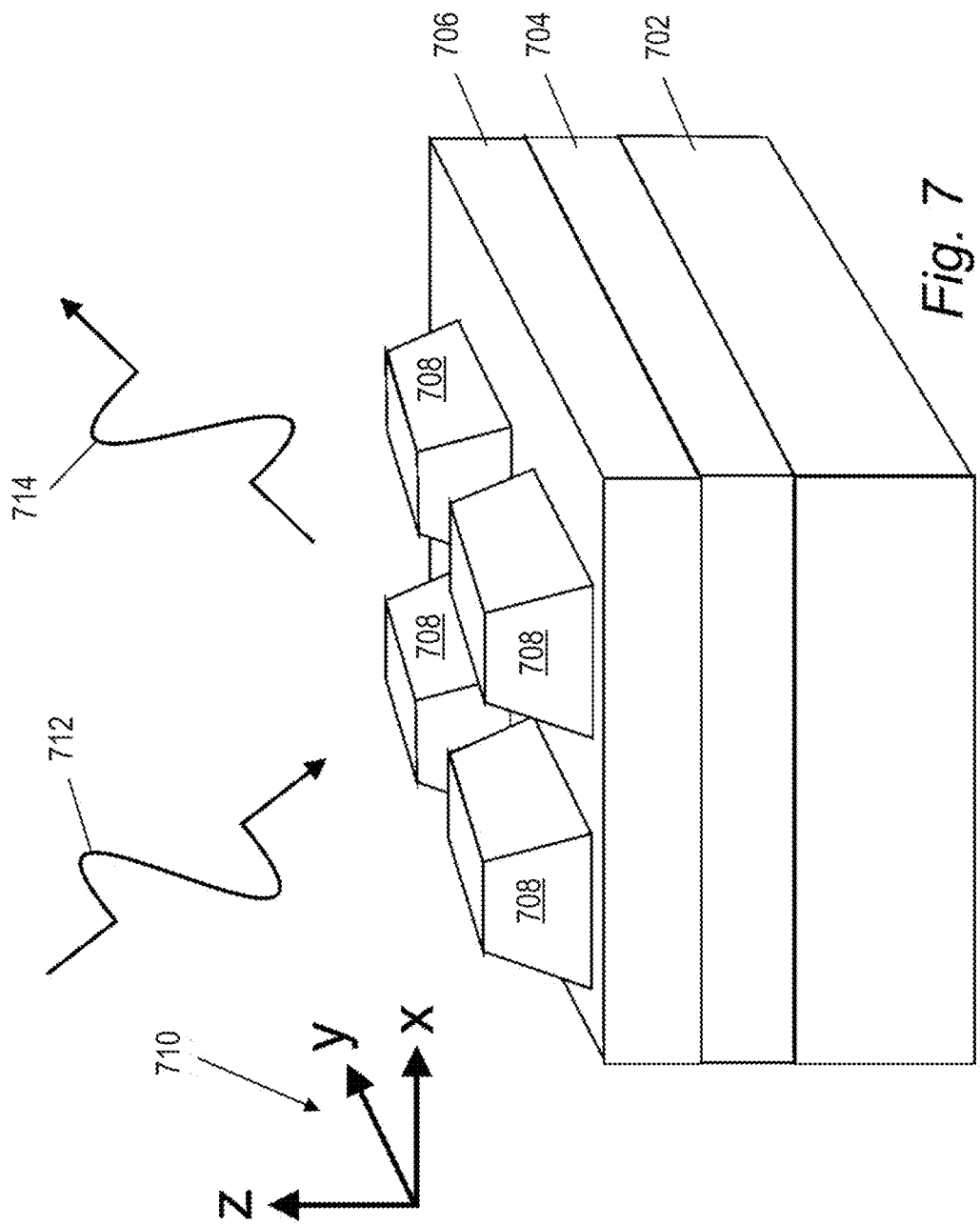

METHODS AND APPARATUS FOR CALCULATING ELECTROMAGNETIC SCATTERING PROPERTIES OF A STRUCTURE AND FOR RECONSTRUCTION OF APPROXIMATE STRUCTURES

FIELD

The present invention relates to calculation of electromagnetic scattering properties of structures.

The invention may be applied for example in metrology of microscopic structures, for example to assess critical dimensions (CD) performance of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

More generally, it would be useful to be able to compare the scattered radiation with scattering behaviors predicted mathematically from models of structures, which can be freely set up and varied until the predicted behavior matches the observed scattering from a real sample. Unfortunately, although it is in principle known how to model the scattering by numerical procedures, the computational burden of the known techniques renders such techniques impractical, particularly if real-time reconstruction is desired, and/or where the structures involved are more complicated than a simple structure periodic in one-dimension.

CD reconstruction belongs to a group of problems known under the general name of inverse scattering, in which observed data is matched to a possible physical situation. The aim is to find a physical situation that gives rise to the observed data as closely as possible. In the case of scatterometry, the electromagnetic theory (Maxwell's equations) allows one to predict what will be the measured (scattered) data for a given physical situation. This is called the forward scattering problem. The inverse scattering problem is now to find the proper physical situation that corresponds to the actual measured data, which is typically a highly nonlinear problem. To solve this inverse scattering problem, a nonlinear solver is used that uses the solutions of many forward scattering problems. In known approaches for reconstruction, the nonlinear problem is founded on three ingredients:

Gauss-Newton minimization of the difference between measured data and data computed from the estimated scattering setup;

parameterized shapes in the scattering setup, e.g. radius and height of a contact hole;

sufficiently high accuracy in the solution of the forward problem (e.g. computed reflection coefficients) each time the parameters are updated.

For CD reconstruction of 1D- or 2D-periodic structures (e.g. gratings) a Volume Integral Method (VIM) can be used to efficiently compute the solution of the pertaining scattering problem, as has been disclosed in US patent application publication no. US2011/0218789 A1 and US patent application publication no. US2011/0098992 A1, which are incorporated herein by reference. The particular choice for a spectral expansion in the plane of periodicity, results in a fully decoupled modal description in the orthogonal aperiodic direction. This modal description, which takes the form of a sequence of 1-dimensional integral equations, each with a 1D Green's function that describes the wave propagation per mode, is discretized or sampled to arrive at a numerical scheme. For a low-order discretization scheme, the structure of the 1D integral equations leads to a numerically stable and efficient O(N) algorithm for the matrix-vector product, where N is the number of samples per 1D integral equation.

For a higher-order discretization scheme it is possible to arrive at a structure for the 1D integral equations that leads to an efficient O(N log N) algorithm for the matrix-vector product, where N is the polynomial order per 1D integral equation.

SUMMARY

It is desirable in the field of semiconductor processing to rapidly perform accurate calculations of electromagnetic scattering properties.

According to a first aspect of the present invention, there is provided a method for reconstructing a parameter of a lithographic process comprising the step of designing a preconditioner suitable for an input system comprising the difference of a first matrix and a second matrix, the first matrix being arranged to have a multi-level structure of at least three levels whereby at least two of said levels comprise a Toeplitz structure.

According to a second aspect of the present invention, there is provided a computer program product containing one or more sequences of machine-readable instructions for calculating electromagnetic scattering properties of a structure, the instructions being adapted to cause one or more processors to perform a method according to the first aspect.

According to a third aspect of the present invention, there is provided an inspection apparatus for reconstructing an approximate structure of an object, the inspection apparatus comprising: an illumination system configured to illuminate the object with radiation; a detection system configured to detect an electromagnetic scattering property arising from the illumination; and a processor configured to reconstruct a parameter of said structure by performing the method the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 7 depicts the scattering geometry that may be reconstructed in accordance with an embodiment of the present invention.

Figure 1:
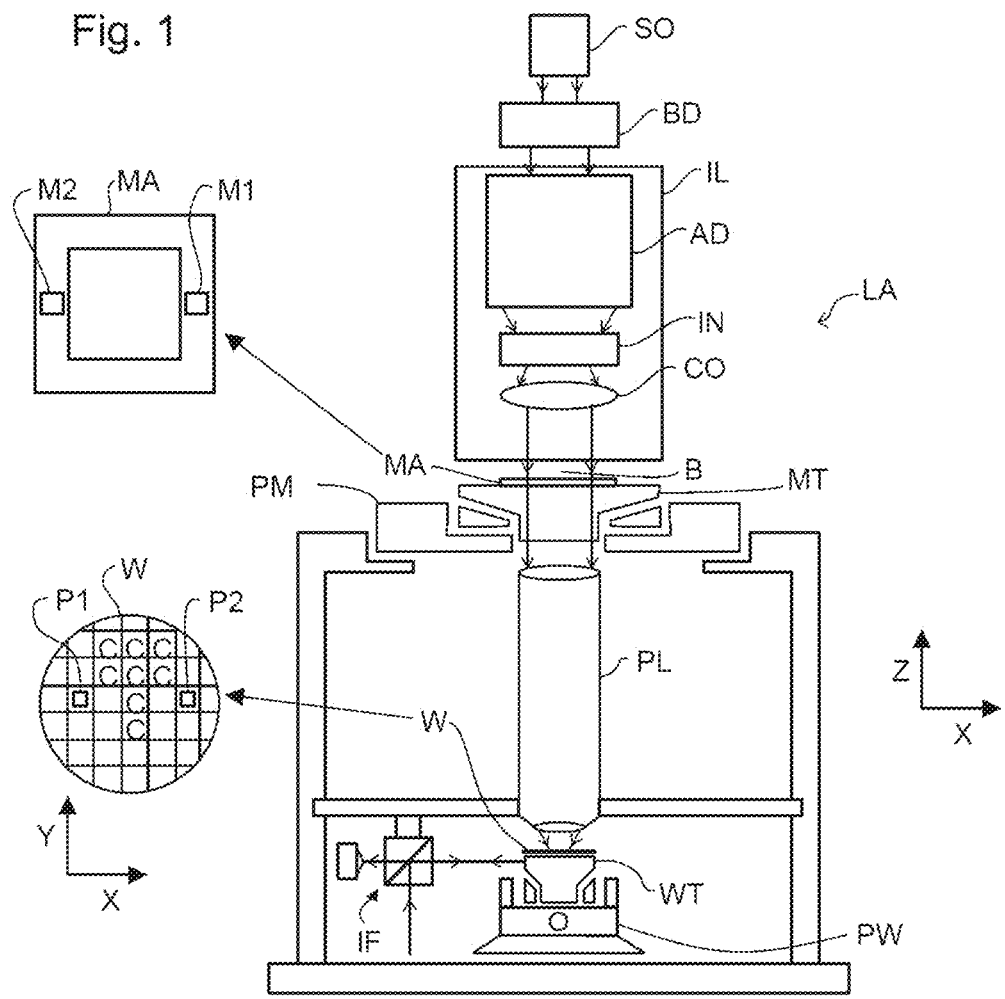
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present example environments in which embodiments of the present invention may be implemented.

FIG. 1 schematically depicts a lithographic apparatus. The apparatus comprises: an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
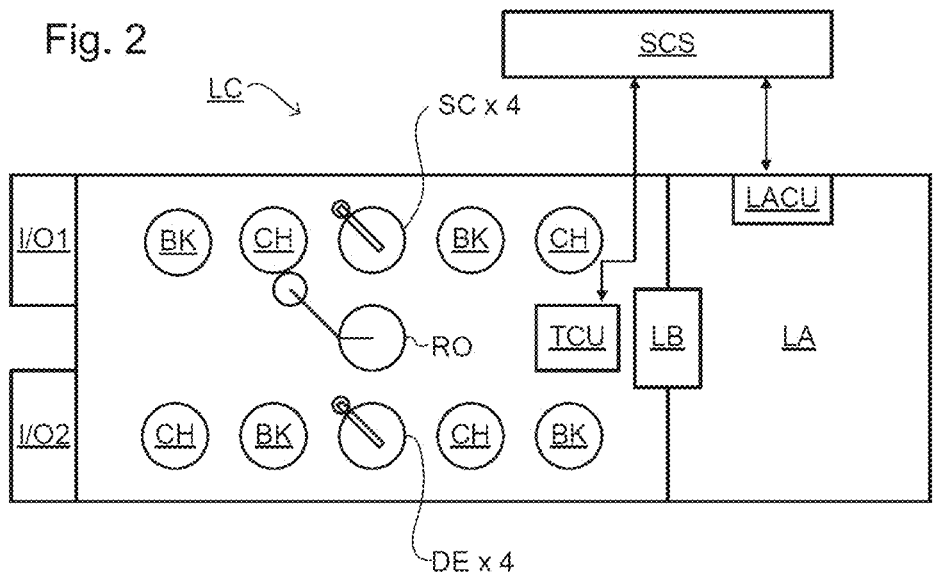
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
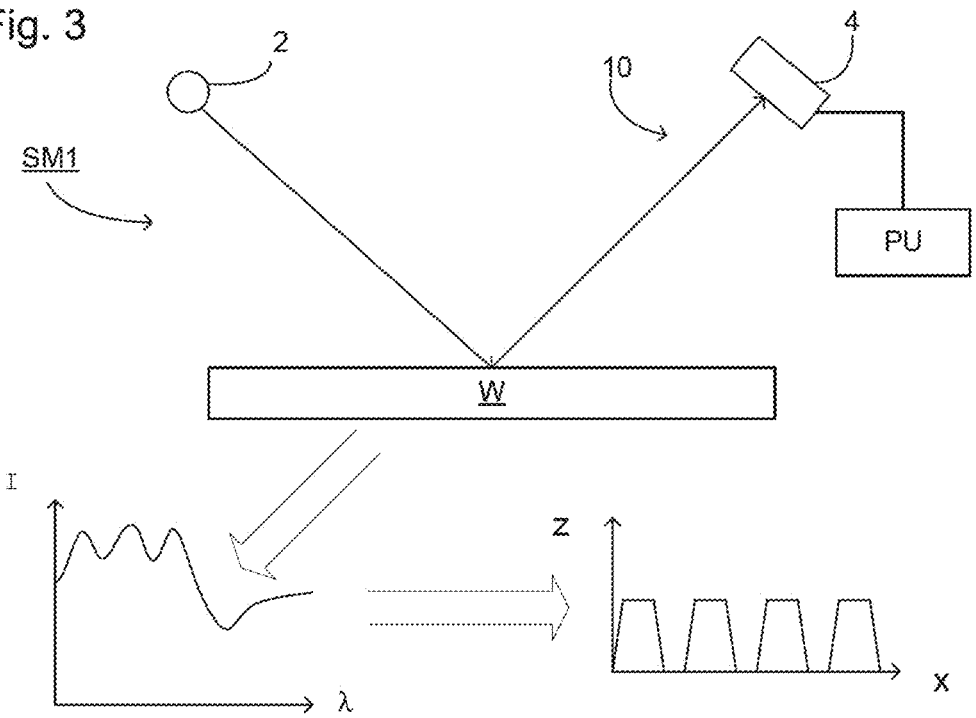
FIG. 3 depicts a first scatterometer.

FIG. 3 depicts a scatterometer which may be used in an embodiment of the present invention. It comprises a broad-band (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., conventionally by Rigorous Coupled Wave Analysis (RCWA) and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
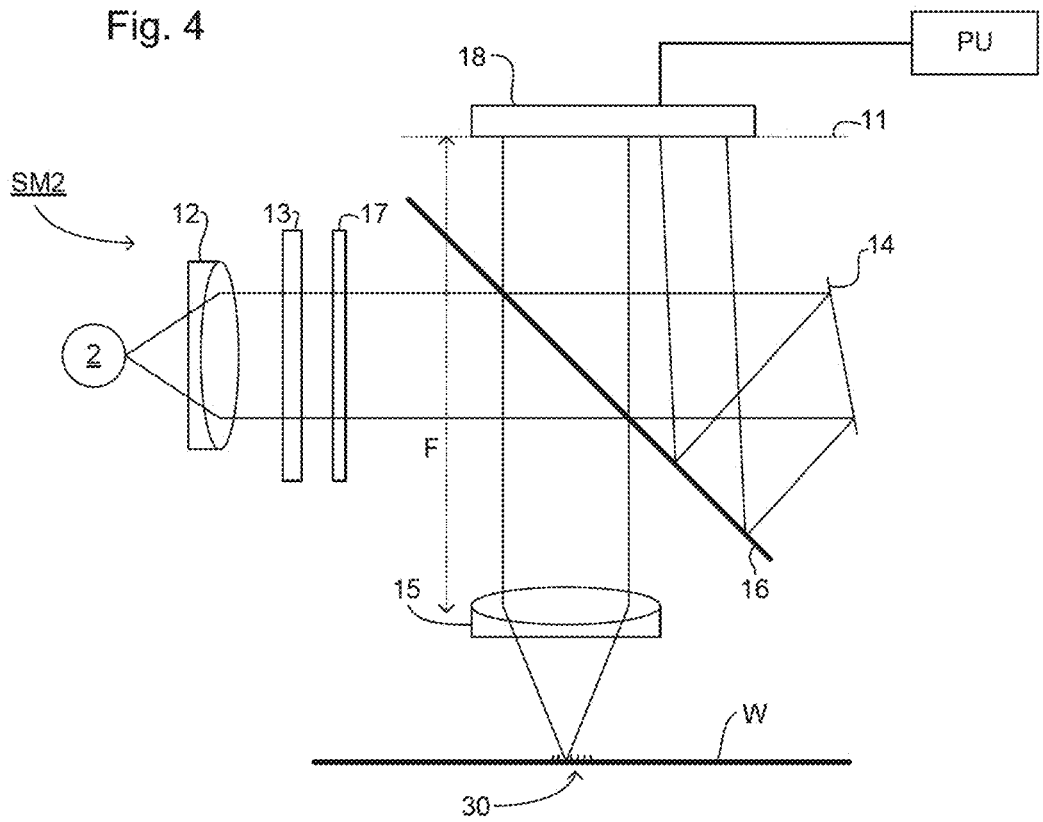
FIG. 4 depicts a second scatterometer.

Another scatterometer that may be used in an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of AX and a spacing of at least 2 AX (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Modelling

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Using one of the scatterometers described above in combination with modeling of a target structure such as the target 30 and its diffraction properties, measurement of the shape and other parameters of the structure can be performed in a number of ways. In a first type of process, represented by FIG. 5, a diffraction pattern based on a first estimate of the target shape (a first candidate structure) is calculated and compared with the observed diffraction pattern. Parameters of the model are then varied systematically and the diffraction re-calculated in a series of iterations, to generate new candidate structures and so arrive at a best fit. In a second type of process, represented by FIG. 6, diffraction spectra for many different candidate structures are calculated in advance to create a 'library' of diffraction spectra. Then the diffraction pattern observed from the measurement target is compared with the library of calculated spectra to find a best fit. Both methods can be used together: a coarse fit can be obtained from a library, followed by an iterative process to find a best fit.

Figure 5:
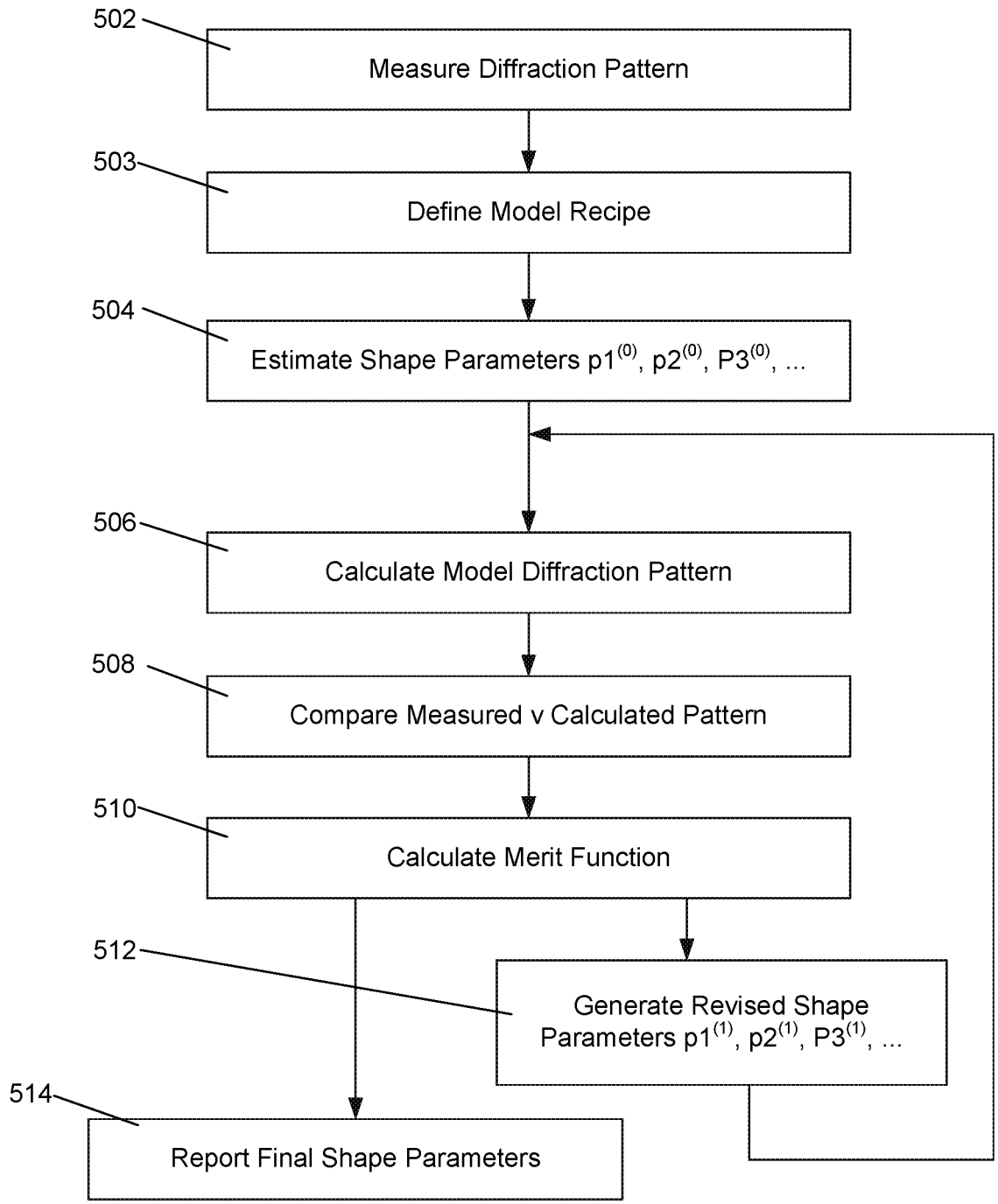
FIG. 5 depicts a first example process using an embodiment of the invention for reconstruction of a structure from scatterometer measurements.

Referring to FIG. 5 in more detail, the way the measurement of the target shape and/or material properties is carried out will be described in summary. The target will be assumed for this description to be a 1-dimensional (1-D) structure. In practice it may be 2-dimensional, and the processing will be adapted accordingly.

In step 502, the diffraction pattern of the actual target on the substrate is measured using a scatterometer such as those described above. This measured diffraction pattern is forwarded to a calculation system such as a computer. The calculation system may be the processing unit PU referred to above, or it may be a separate apparatus.

In step 503, a 'model recipe' is established which defines a parameterized model of the target structure in terms of a number of parameters $p_i$ ($p_1$, $p_2$, $p_3$ and so on). These parameters may represent for example, in a 1D periodic structure, the angle of a side wall, the height or depth of a feature, the width of the feature. Properties of the target material and underlying layers are also represented by parameters such as refractive index (at a particular wavelength present in the scatterometry radiation beam). Specific examples will be given below. Importantly, while a target structure may be defined by dozens of parameters describing its shape and material properties, the model recipe will define many of these to have fixed values, while others are to be variable or 'floating' parameters for the purpose of the following process steps. Further below we describe the process by which the choice between fixed and floating parameters is made. Moreover, we shall introduce ways in which parameters can be permitted to vary without being fully independent floating parameters. For the purposes of describing FIG. 5, only the variable parameters are considered as parameters $p_i$.

In step 504: A model target shape is estimated by setting initial values $p_i^{(0)}$ for the floating parameters (i.e. $p_1^{(0)}$, $p_2^{(0)}$, $p_3^{(0)}$ and so on). Each floating parameter will be generated within certain predetermined ranges, as defined in the recipe.

In step 506, the parameters representing the estimated shape, together with the optical properties of the different elements of the model, are used to calculate the scattering properties, for example using a rigorous optical diffraction method such as RCWA or any other solver of Maxwell equations. This gives an estimated or model diffraction pattern of the estimated target shape.

In steps 508 and 510, the measured diffraction pattern and the model diffraction pattern are then compared and their similarities and differences are used to calculate a "merit function" for the model target shape.

In step 512, assuming that the merit function indicates that the model needs to be improved before it represents accurately the actual target shape, new parameters $p_1^{(1)}$, $p_2^{(1)}$, $p_3^{(1)}$, etc. are estimated and fed back iteratively into step 506. Steps 506-512 are repeated.

In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

In step 514, when the merit function indicates that this iterative process has converged on a solution with a desired accuracy, the currently estimated parameters are reported as the measurement of the actual target structure.

The computation time of this iterative process is largely determined by the forward diffraction model used, i.e. the calculation of the estimated model diffraction pattern using a rigorous optical diffraction theory from the estimated target structure. If more parameters are required, then there are more degrees of freedom. The calculation time increases in principle with the power of the number of degrees of freedom.

The estimated or model diffraction pattern calculated at 506 can be expressed in various forms. Comparisons are simplified if the calculated pattern is expressed in the same form as the measured pattern generated in step 510. For example, a modeled spectrum can be compared easily with a spectrum measured by the apparatus of FIG. 3; a modeled pupil pattern can be compared easily with a pupil pattern measured by the apparatus of FIG. 4.

Throughout this description from FIG. 5 onward, the term 'diffraction pattern' will be used, on the assumption that the scatterometer of FIG. 4 is used. The skilled person can readily adapt the teaching to different types of scatterometer, or even other types of measurement instrument.

Figure 6:
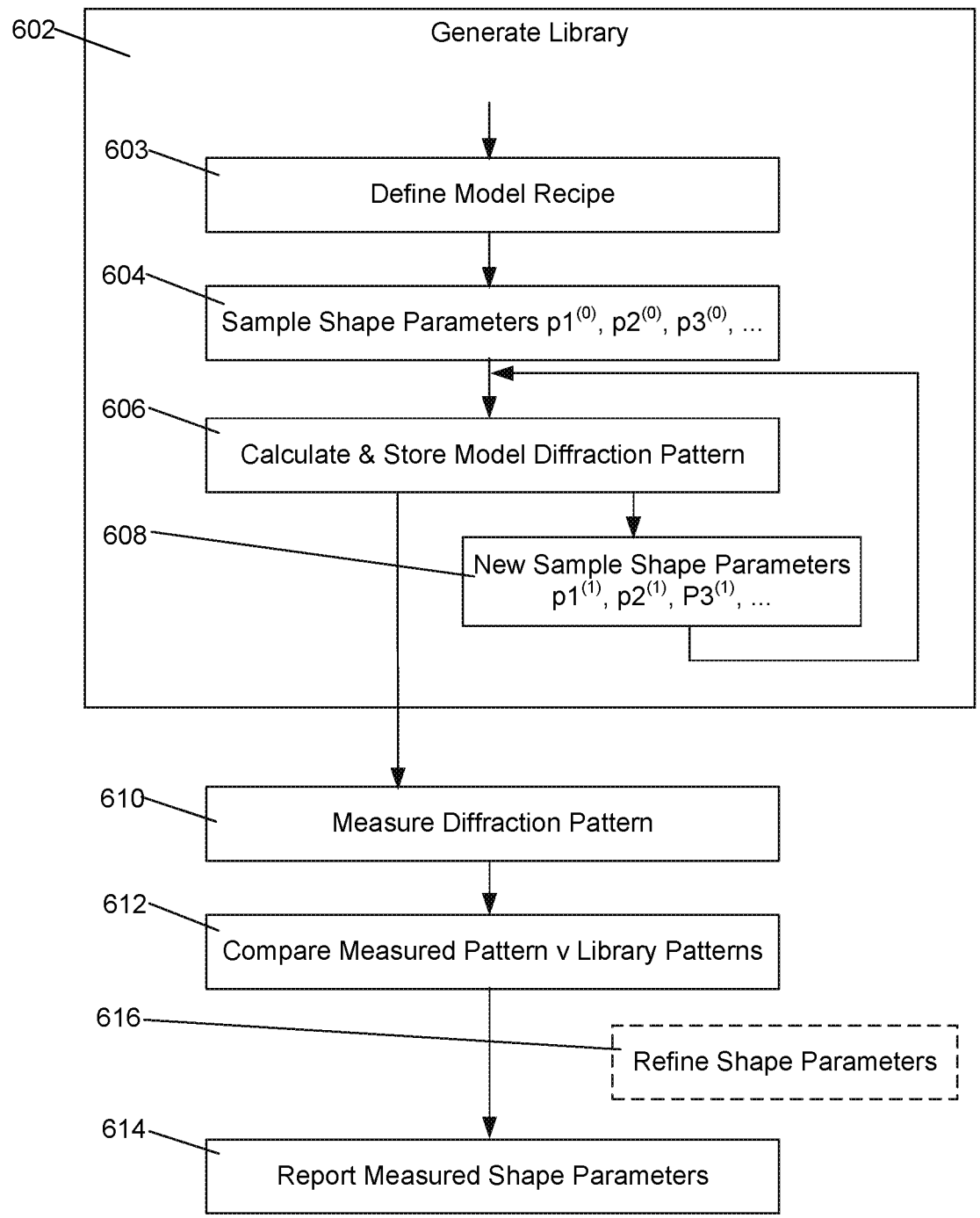
FIG. 6 depicts a second example process using an embodiment of the invention for reconstruction of a structure from scatterometer measurements.

FIG. 6 illustrates an alternative example process in which plurality of model diffraction patterns for different estimated target shapes (candidate structures) are calculated in advance and stored in a library for comparison with a real measurement. The underlying principles and terminology are the same as for the process of FIG. 5. The steps of the FIG. 6 process are:

In step 602, the process of generating the library is performed. A separate library may be generated for each type of target structure. The library may be generated by a user of the measurement apparatus according to need, or may be pre-generated by a supplier of the apparatus.

In step 603, a 'model recipe' is established which defines a parameterized model of the target structure in terms of a number of parameters $p_i$ ($p_1$, $p_2$, $p_3$ and so on). Considerations are similar to those in step 503 of the iterative process.

In step 604, a first set of parameters $p_1^{(0)}$, $p_2^{(0)}$, $p_3^{(0)}$, etc. is generated, for example by generating random values of all the parameters, each within its expected range of values.

In step 606, a model diffraction pattern is calculated and stored in a library, representing the diffraction pattern expected from a target shape represented by the parameters.

In step 608, a new set of parameters $p_1^{(1)}$, $p_2^{(1)}$, $p_3^{(1)}$, etc. is generated. Steps 606-608 are repeated tens, hundreds or even thousands of times, until the library which comprises all the stored modeled diffraction patterns is judged sufficiently complete. Each stored pattern represents a sample point in the multi-dimensional parameter space. The samples in the library should populate the sample space with a sufficient density that any real diffraction pattern will be sufficiently closely represented.

In step 610, after the library is generated (though it could be before), the real target 30 is placed in the scatterometer and its diffraction pattern is measured.

In step 612, the measured pattern is compared with the modeled patterns stored in the library to find the best matching pattern. The comparison may be made with every sample in the library, or a more systematic searching strategy may be employed, to reduce computational burden.

In step 614, if a match is found then the estimated target shape used to generate the matching library pattern can be determined to be the approximate object structure. The shape parameters corresponding to the matching sample are output as the measured shape parameters. The matching process may be performed directly on the model diffraction signals, or it may be performed on substitute models which are optimized for fast evaluation.

In step 616, optionally, the nearest matching sample is used as a starting point, and a refinement process is used to obtain the final parameters for reporting. This refinement process may comprise an iterative process very similar to that shown in FIG. 5, for example.

Whether refining step 616 is needed or not is a matter of choice for the implementer. If the library is very densely sampled, then iterative refinement may not be needed because a good match will always be found. On the other hand, such a library might too large for practical use. A practical solution is thus to use a library search for a coarse set of parameters, followed by one or more iterations using the merit function to determine a more accurate set of parameters to report the parameters of the target substrate with a desired accuracy. Where additional iterations are performed, it would be an option to add the calculated diffraction patterns and associated refined parameter sets as new entries in the library. In this way, a library can be used initially which is based on a relatively small amount of computational effort, but which builds into a larger library using the computational effort of the refining step 616. Whichever scheme is used, a further refinement of the value of one or more of the reported variable parameters can also be obtained based upon the goodness of the matches of multiple candidate structures. For example, the parameter values finally reported may be produced by interpolating between parameter values of two or more candidate structures, assuming both or all of those candidate structures have a high matching score.

The computation time of this iterative process is largely determined by the forward diffraction model at steps 506 and 606, i.e. the calculation of the estimated model diffraction pattern using a rigorous optical diffraction theory from the estimated target shape.

For CD reconstruction of 2D-periodic structures RCWA is commonly used in the forward diffraction model, while the Differential Method, the Volume Integral Method (VIM), Finite-difference time-domain (FDTD), and Finite element method (FEM) have also been reported. A Fourier series expansion as for example used in RCWA and the Differential Method can also be used to analyze aperiodic structures by employing perfectly matched layers (PMLs), or other types of absorbing boundary conditions to mimic radiation towards infinity, near the boundary of the unit cell on which the Fourier expansions are used.

Volume Integral Method

One of the major problems of RCWA is that it requires a large amount of central processing unit (CPU) time and memory for 2D periodic structures, since a sequence of eigenvalue/eigenvector problems need to be solved and concatenated. For FDTD and FEM, CPU time is typically also too high.

Known Volume Integral Methods (as disclosed in U.S. Pat. No. 6,867,866 B1 and U.S. Pat. No. 7,038,850 B2) are based either on fully spatial discretization schemes that exhibit slow convergence with respect to mesh refinement or on spectral discretization schemes that exhibit poor convergence with respect to an increasing number of harmonics. As an alternative, a spectral discretization scheme that incorporates a heuristic method to improve the convergence was proposed.

The linear system that has to be solved for VIM is much larger compared to RCWA, but if it is solved in an iterative way, only the matrix-vector product is needed together with the storage of several vectors. Therefore, the memory usage is typically much lower than for RCWA. The potential bottleneck is the speed of the matrix-vector product itself. If the Li rules, also known as the Fourier factorization rules, were to be applied in VIM, then the matrix-vector product would be much slower, due to the presence of several inverse sub-matrices. Alternatively, the Li rules can be ignored and FFTs can be used to arrive at a fast matrix-vector product, but the problem of poor convergence remains.

FIG. 7 illustrates schematically the scattering geometry that may be reconstructed in accordance with an embodiment of the present invention. A substrate 702 is the lower part of a medium layered in the z direction. Other layers 704 and 706 are shown. A two dimensional grating 708 that is periodic in x and y is shown on top of the layered medium. The x, y and z axes are also shown 710. An incident field 712 interacts with and is scattered by the structure 702 to 708 resulting in a reflected field 714. Thus the structure is periodic in at least one direction, x, y, and includes materials of differing properties such as to cause a discontinuity in an electromagnetic field, $E^{tot}$, that comprises a total of incident, $E^{inc}$, and scattered, $E^s$, electromagnetic field components at a material boundary between the differing materials.

Figure 9:
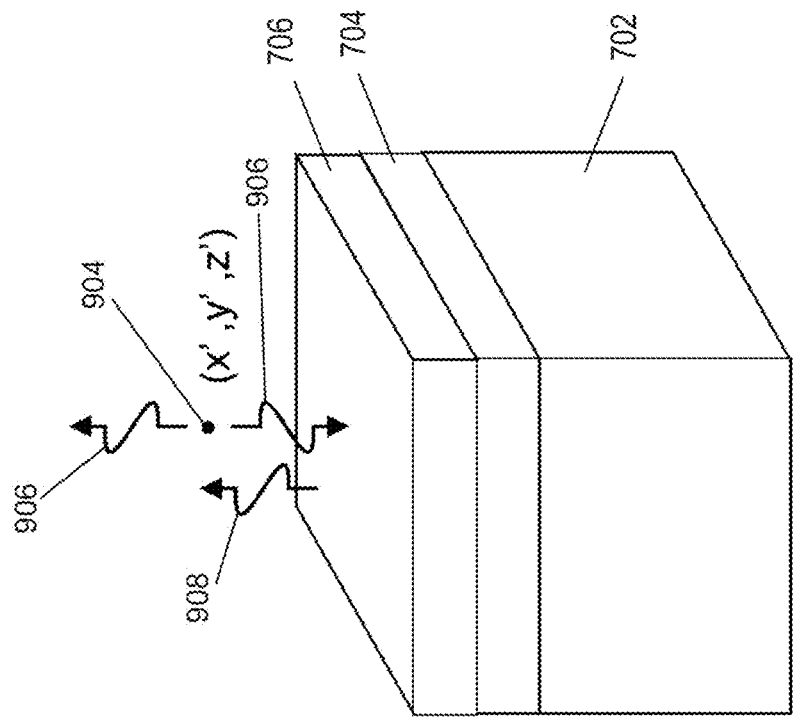
FIG. 9 illustrates use of a Green's function to calculate the interaction of the incident field with the layered medium.
Figure 8:
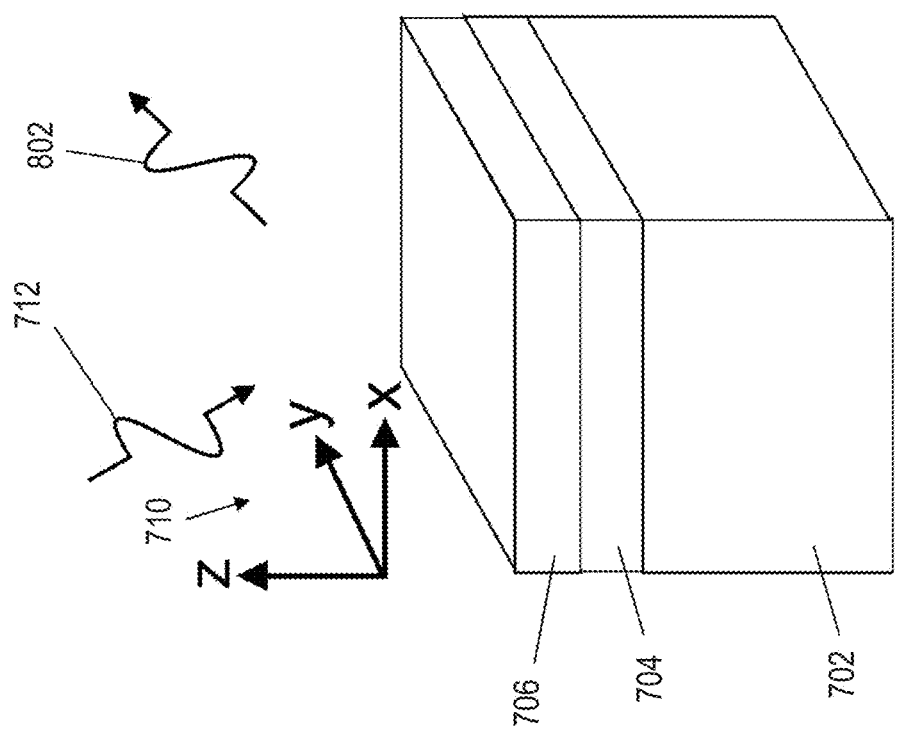
FIG. 8 depicts the structure of the background.

FIG. 8 shows the structure of the background and FIG. 9 schematically illustrates the Green's function that may be used to calculate the interaction of the incident field with the layered medium. In FIGS. 8 and 9, the layered medium 702 to 706 corresponds to the same structure as in FIG. 7. In FIG. 8, the x, y and z axes are also shown 710 along with the incident field 712. A directly reflected field 802 is also shown. With reference to FIG. 9, the point source (x', y', z') 904 represents the Green's function interaction with the background that generates a field 906. In this case because the point source 904 is above the top layer 706 there is only one background reflection 908 from the top interface of 706 with the surrounding medium. If the point source is within the layered medium then there will be background reflections in both up and down directions (not shown).

The VIM formula to be solved is $$E^{inc}(x,y,z)=E^{tot}(x,y,z)-\iiint \overline{G}(x,x',y,y',z,z')J^c(x',y',z')dk'dy'dz' \quad (0\text{-}1)$$

$$J^c(x',y',z')=\chi(x',y',z')E^{tot}(x',y',z') \quad (0\text{-}2)$$

In this equation, the incident field $E^{inc}$ is a known function of angle of incidence, polarization and amplitude, $E^{tot}$ is the total electric field that is unknown and for which the solution is calculated, $J^c$ is the contrast current density, $\overline{G}$ is the Green's function (a 3×3 matrix), $\chi$ is the contrast function given by $j\omega(\varepsilon(x,y,z,)-\varepsilon_b(z))$, where $\varepsilon$ is the permittivity of the structure and $\varepsilon_b$ is the permittivity of the background medium. $\chi$ is zero outside the gratings.

The Green's function $\overline{G}(x, x', y, y', z, z')$ is known and computable for the layered medium including 702 to 706. The Green's function shows a convolution and/or modal decomposition ($m_1$, $m_2$) in the xy (transverse) plane and the dominant computation burden along the z axis in $\overline{G}$ are convolutions.

For discretization, the total electric field is expanded in Bloch/Floquet modes in the xy plane. Multiplication with $\chi$ becomes: (a) discrete convolution in the xy plane (2D FFT); and (b) product in z. The Green's function interaction in the xy plane is an interaction per mode. The Green's function interaction in z that corresponds to a homogeneous background medium is a convolution that may be performed with one-dimensional (1D) FFTs with a complexity $\mathcal{O}$ (N log N). Alternatively, but not shown in the figure, the Green's function interaction in z can be computed by exploiting its semi-separability property via an upward and downward recurrence relation in z, with a complexity $\mathcal{O}$ (N). The contributions from the reflections of the layered medium above and below the grating can be added by reusing a part of the result that has already been computed as part of the interaction for a homogeneous background medium.

The number of modes in xy is $M_1M_2$ and the number of samples in z is N.

The efficient matrix-vector product has a complexity $\mathcal{O}(M_1M_2N\ \log(M_1M_2N))$ and the storage complexity is $\mathcal{O}(M_1M_2N)$.

Figure 10:
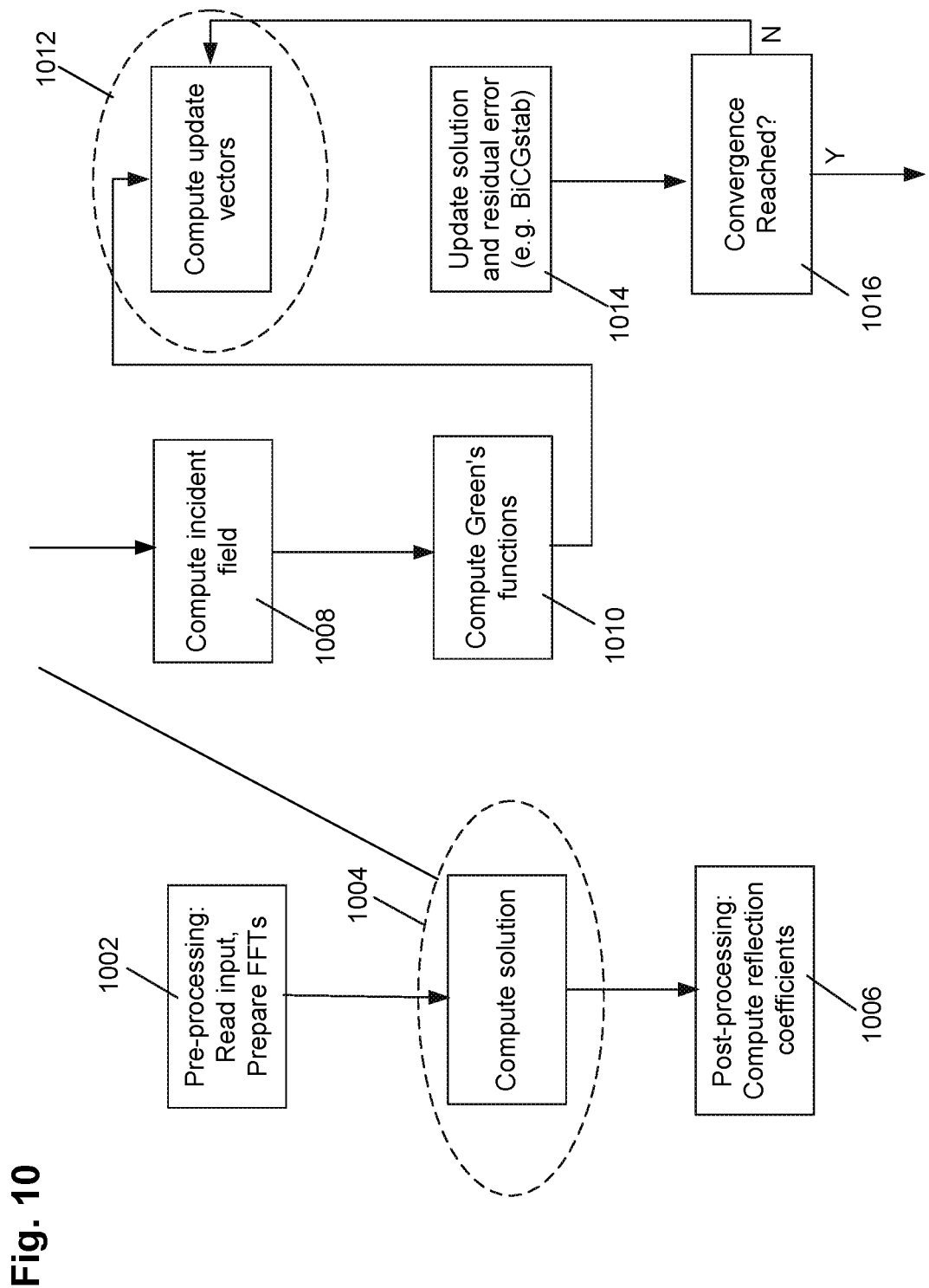
FIG. 10 is a flow chart of the high level method of solving the linear system corresponding to the VIM formula for the contrast current density, the electric field, or a vector field that is composed of a linear combination of the electric field and the electric flux density.

The VIM solution method for Ax=b is performed using an iterative solver based on a Krylov subspace method, e.g., BiCGstab(l) (Stabilized BiConjugate Gradient method), which typically has the steps:

Define residual error as $r_n=b-Ax_n$
Compute update vector(s) $v_n$ via residual error
Update solution: $x_{n+1}=x_n+\alpha_n\ v_n$
Update residual error $r_{n+1}=r_n-\alpha_n\ Av_n$ FIG. 10 is a flow chart of the high level method of solving the linear system corresponding to the VIM formula. This is a method of calculating electromagnetic scattering properties of a structure, by numerically solving a volume integral. At the highest level the first step is pre-processing 1002, including reading the input and preparing FFTs. The next step is to compute the solution 1004. Finally, post-processing 1006 is performed in which reflection coefficients are computed. Step 1004 includes various steps also shown at the right hand side of FIG. 10. These steps are computing the incident field 1008, computing the Green's Functions 1010, computing the update vectors 1012, updating the solution and residual error (e.g., using BiCGstab) 1014 and testing to see if convergence is reached 1016. If convergence is not reached control loops back to step 1012 that is the computation of the update vectors.

The linear system, such as that described above, formed by the fully numerical method from the class of volume integral methods for solving scattering problems for 2D periodic structures can be of an order of magnitude of 10000 by 10000 (or larger). Therefore, standard iterative solvers (in contrast to direct solvers) may be used to solve such a system. These solvers have the undesirable property that the number of iterations is strongly problem (stack/material) dependent. Prior experience has shown that high-n materials (silicon, poly-silicon, amorphous silicon, etc.) as well as high-k materials (copper, tungsten, aluminum etc.) negatively affect the convergence of the iterative solver and it results in an unacceptable reconstruction time. In some cases (typically for metal structures) the solvers do not converge to a solution at all.

The fully numerical method from the class of volume integral methods for solving scattering problems for 2D periodic structures can be seen as consisting of two stages:

(1) discretization, i.e. building the linear system, and (2) solution of a linear system as described above, i.e., of the form:

$$Ax=b, \text{ with } A=C-GM. \quad (0\text{-}3)$$

In equation (0-3), the elements of matrix A (or input system) represent the material properties and geometry description, the elements of column vector b represent the incident illumination, and the column vector x is an auxiliary field which is related to the total electric field consisting of the unknown scattered field and the known incident field. Therefore, the detrimental effect of the high k and/or high n materials is present in the spectral properties of the matrix A. As described in earlier US patent publications/patents US2011/0218789A, U.S. Pat. Nos. 8,706,455B, 8,645,109B and US20130066597A, the disclosures of which are hereby incorporated by reference herein in their entirety, G is the Green's function matrix and M is the contrast matrix (contrast between materials). Matrix C is a convolution-and-change-of-basis operator which links a vector field, F to a related electric field, E. The vector field, F, is represented by at least one finite Fourier series with respect to at least one direction, x, y, and the step of numerically solving the volume integral equation comprises determining a component of the electric field, E, by convolution of the vector field, F, with operator, C, and determining a current density, J, by convolution of the vector field, F, with a convolution operator, M. The convolution-and-change-of-basis operator, C, is invertible and comprises material and geometric properties of the structure in at least one direction x, y and is configured to transform the vector field, F, to the electric field, E, by performing a change of basis according to the material and geometric properties. Referring to Equation (0-4) below, operator C is constructed using a global or local normal vector field indicated by the projection operators $P_T$ and $P_n$ and the material properties indicated by the operator $M_\epsilon$ for particular choices of (in the local normal vector field example) the scaling parameter α.

As such, the electric field E and vector field F are related according to the following equation (in the localized case, for the global case there is no scaling parameter α):

$$E=CF=[P_T+(P_n M_\epsilon P_n)^{-1}(1/\alpha P_n-P_n M_\epsilon P_T)]F, \quad (0\text{-}4)$$

It is well known that the convergence of an iterative solver can be improved by preconditioning. Thus, instead of solving the original system, it may be replaced by an equivalent left preconditioned system, $$P^{-1}Ax=P^{-1}b, \quad (0\text{-}5)$$

or right preconditioned system, $$AP^{-1}y=b, \text{ with } x=P^{-1}y, \quad (0\text{-}6)$$

where P is a non-singular and such that the matrix $P^{-1}A$ or $AP^{-1}$ has favorable spectral properties over A. A good preconditioner is one that is cheap to apply and clusters together the spectrum of the resulting matrix. The latter property is obtained for instance in the case that P≈A. Typically, as the approximation P gets closer to A, the cost of the matrix-vector product with P increases, while the number of iterations of the iterative solver decreases. Thus, the optimal preconditioner is found by a trade-off between the number of iterations and the cost per iteration.

Toeplitz, BTTB and BTTB-Block Matrices

It is recognized that the matrix C can be a good approximation for A. The matrix C comprises a Toeplitz structure on at least two levels. The level of the input system (A or its component C, for example) is defined by the existence of blocks of matrices. A block is an arbitrary element in the matrix. A level of a matrix is defined as a particular division of the matrix into matrix blocks. At the lowest level the matrix blocks are in fact single elements (scalars). The higher the level, the larger are the matrix blocks that build up the matrix. A Toeplitz matrix has constant-valued elements along all of its diagonals. This means that it is possible to completely describe such a matrix by its first column and first row.

More specifically, the matrix C may be of a structure comprising blocks which each have a BTTB-Block structure, where BTTB describes a Block-Toeplitz-Toeplitz-Block structure. The matrix C may, for example, comprise a structure having BTTB-Block matrices along the diagonal and zero elements elsewhere. As such, matrix C may comprise a block-diagonal matrix having a Toeplitz structure on at least two lower levels, and specifically a block-diagonal matrix where each non-zero element (i.e., those along the diagonal) are each a BTTB-Block matrix.

To understand such a structure, appreciate that a block matrix $T_{TB}^{(m;n)} \in \mathbb{C}^{m \cdot n \times m \cdot n}$ where each of the m×m blocks is a n×n Toeplitz matrix is called a Toeplitz-Block matrix. It has the form:

$$T_{TB}^{(m;n)} = \begin{pmatrix} T_{1,1;} & T_{1,2;} & \cdots & T_{1,m;} \\ T_{2,1;} & T_{2,2;} & \cdots & T_{2,m;} \\ \vdots & \vdots & \ddots & \vdots \\ T_{m,1;} & T_{m,2;} & \cdots & T_{m,m;} \end{pmatrix}, \text{ where } T_{i,j;} \text{ is Toeplitz} \quad (1\text{-}1)$$

This is in contrast to a Block-Toeplitz matrix $T_{BT}^{(m;n)} \in \mathbb{C}^{m \cdot n \times m \cdot n}$, which is a block matrix of the form:

$$T_{BT}^{(m;n)} = \begin{pmatrix} A_0; & A_{-1;} & \cdots & A_{1-m;} \\ A_1; & A_0; & \cdots & A_{2-m;} \\ \vdots & \vdots & \ddots & \vdots \\ A_{m-1;} & A_{m-2;} & \cdots & A_0; \end{pmatrix}, \quad (1\text{-}2)$$

where $A_{k;}$ is arbitrary

Combining the two structures, a BTTB matrix is a block-Toeplitz matrix, where the blocks $T_k$; are themselves Toeplitz matrices. Such a BTTB matrix is an example of multi-level Toeplitz matrix, i.e., a matrix which is Toeplitz on at least two levels. More specifically, a BTTB matrix $T_{BTTB}^{(m;n)}$ may take the form:

$$T_{BTTB}^{(m;n)} = \begin{pmatrix} T_0; & T_{-1;} & \cdots & T_{1-m;} \\ T_1; & T_0; & \cdots & T_{2-m;} \\ \vdots & \vdots & \ddots & \vdots \\ T_{m-1;} & T_{m-2;} & \cdots & T_0; \end{pmatrix}, \text{ where } T_k; \text{ is Toeplitz} \quad (1\text{-}3)$$

A BTTB matrix corresponds to a generating function $f(x,y)$ with two variables x, y, i.e.:

$$t_{k,l} = \left(\frac{1}{2\pi}\right)^2 \int_{-\pi}^{\pi}\int_{-\pi}^{\pi} f(x,y) e^{-i(kx+ly)} dx dy \qquad (1-4)$$

hence $$f(x,y) = \sum_{k=-\infty}^{\infty} \sum_{l=-\infty}^{\infty} t_{k,l} e^{i(kx+ly)} \qquad (1-5)$$

A BTTB-Block matrix $T_{BTTB-B}^{(l;m;n)}$ is therefore one having a general form:

$$T_{BTTB-B}^{(l;m;n)} = \begin{pmatrix} T_{l,1,1;} & T_{l,1,2;} & \cdots & T_{l,1,m;} \\ T_{l,2,1;} & T_{l,2,2;} & \cdots & T_{l,2,m;} \\ \vdots & \vdots & \ddots & \vdots \\ T_{l,m,1;} & T_{l,m,2;} & \cdots & T_{l,m,m;} \end{pmatrix}, \text{ where} \qquad (1-6)$$

$T_{l,i,j;}$ is BTTB

A preconditioner for BTTB matrices is described in literature, for example:

in F.-R. Lin and C.-X. Wang. BTTB preconditioners for BTTB systems; Numerical Algorithms 60.1 (2012), pp. 153-167, incorporated herein by reference in its entirety or in J. Kamm and J. G. Nagy. Optimal Kronecker product approximation of block Toeplitz matrices; SIAM Journal on Matrix Analysis and Applications 22.1 (2000), pp. 155-172, also incorporated herein by reference in its entirety.

However, a preconditioner for a matrix having a structure similar to the non-zero elements of matrix C, i.e., a BTTB-Block structure is not known. If a new matrix (e.g., a BTTB-Block matrix) is formed out of blocks of matrices (e.g., BTTB matrices), each block of matrices having a suitable known preconditioner, then these suitable preconditioners determined for the individual blocks cannot be assumed to provide a solution in determining a preconditioner for the new matrix. Simply using a suitable known preconditioner on each corresponding block does not mean that the resulting matrix will be a good preconditioner. In other words, while a preconditioner aids the inversion of the matrix in a block, the inversion of the composite new matrix (formed by such preconditioners) is not trivial.

The complete matrix C may be considered for use as a preconditioner (P=C). Compared to the subsequent preconditioners, that are based on C but are approximations of it, this choice is the best in terms of reducing iterations. However, each iteration is computationally expensive, as is the inversion of C. Nevertheless, using the complete matrix C can be a good choice for hard problems and is additionally an interesting reference point for the subsequent preconditioners disclosed herein.

An exact inversion of a BTTB-block matrix can done using the Gaussian elimination algorithm. However, the complexity is $\mathcal{O}((N_x N_y)^3 N_z)$. So far, no exact inversion formulas with smaller complexity are known for BTTB-block matrices. In addition, since the inverse of a BTTB matrix is not BTTB, $C^{-1}$ does not possess any structure that can be used for an optimized matrix vector product (MVP). This means that the complexity of the MVP with $C^{-1}$ is $\mathcal{O}((N_x N_y)^2 N_z)$.

Equation (1-7) shows the general sparsity pattern of matrix C. At the highest level the matrix C can be arranged in a block-diagonal matrix after permutation, i.e.:

$$C = \begin{pmatrix} C_{1;} & 0 & 0 & 0 \\ 0 & C_{2;} & 0 & 0 \\ 0 & 0 & \ddots & 0 \\ 0 & 0 & 0 & C_{N;} \end{pmatrix} \qquad (1-7)$$

where each element on the diagonal comprises a block $C_l$ of the form:

$$C_l = \begin{pmatrix} C_{l,1,1;} & C_{l,1,2;} & C_{l,1,3;} \\ C_{l,2,1;} & C_{l,2,2;} & C_{l,2,3;} \\ C_{l,3,1;} & C_{l,3,2;} & C_{l,3,3;} \end{pmatrix} \qquad (1-8)$$

where each block $C_{l,i,j;}$ is a BTTB matrix with the following generating function $F_{C_{l,i,j;}}$ $$F_{C_{l,i,j;}}(x,y) = n_i(x,y) n_j(x,y) \left(\frac{\varepsilon^b}{\varepsilon(x,y)} - 1\right) + \delta_{ij} \text{ for} \qquad (1-9)$$

$i, j \in x, y, z$ where $\varepsilon(x,y)$ are the piecewise constant material properties and $n_i(x,y) n_j(x,y)$ are the normal-vector fields, which are piecewise constant for polygonal shapes. An example of such can be found in Appendix B of the paper "Local normal vector field formulation for periodic scattering problems formulated in the spectral domain", van Beurden and Setija JOSAA, February 2017 which is herein incorporated by reference.

Figure 11:
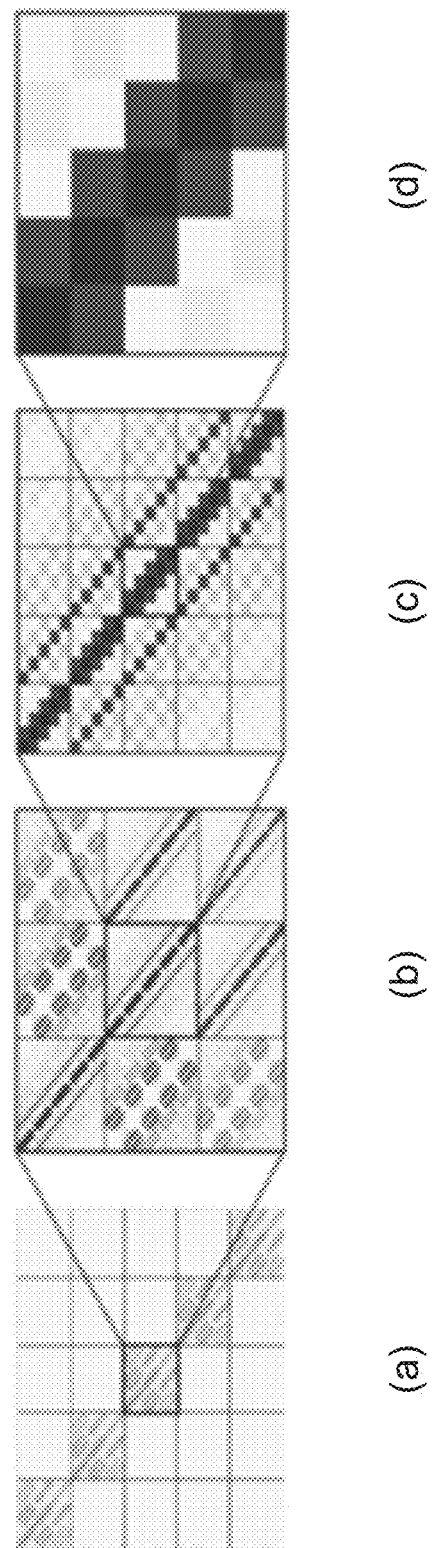
FIG. 11 shows shaded plots for each level of matrix C from (a) top level to (d) bottom level.

Additionally, each $C_l$ is (in this example) symmetric on a block level, i.e., $C_{l,i,j;} = C_{l,j,i;}$. However this is not necessary and each C, may be asymmetric on a block level, e.g. in an embodiment where the VIM model has anisotropy added. FIG. 11 shows color plots of each level of matrix C. On the top level, (FIG. 11(a)) the block-diagonal structure can be seen easily. The next image (FIG. 11(b)) shows the (e.g., 3×3) symmetry that the matrix possesses on the next level. The bottom two levels each possess a Toeplitz structure, which is clearly visible in FIGS. 11(c) and 11(d).

Two preconditioner concepts are proposed herein which are suitable for an input system having three or more levels of which at least two are Toeplitz. More specifically, the preconditioner systems proposed are suitable for BTTB-Block Matrices and therefore can be used for an input system of the form of matrix C.

A first preconditioner concept is based on an inverse generation approximation specifically adapted for a (e.g., 3×3) BTTB-block matrix. A second preconditioner concept is based on a Kronecker sum approximation, again specifically adapted for a (e.g., 3×3) BTTB-block matrix.

Independent of the preconditioner concept used, in addition to global preconditioning, a local preconditioner can also be applied. A local preconditioner can be obtained from a global preconditioner by replacing a subset of the non-zero blocks by identities. Demonstrated for the specific case of matrix C defined in Equation (1-7), the global preconditioner may have the form:

$$P = \begin{pmatrix} P_{1;} & 0 & 0 & 0 \\ 0 & P_{2;} & 0 & 0 \\ 0 & 0 & \ddots & 0 \\ 0 & 0 & 0 & P_{N;} \end{pmatrix}.$$

A local preconditioner can be obtained by choosing, (by way of an arbitrary example), $P_1=P_2=I$, where I represents an identity. In this way the preconditioner will be applied locally to blocks 3 to N, but not to blocks 1 and 2. The advantage of local preconditioning is that it is computationally cheaper to build and apply than the global preconditioner. The disadvantage is that it provides a worse approximation of the input matrix.

Inverse Generating Function (IGF) Preconditioner
Inverse Generating Function Preconditioner for Toeplitz or BTTB Matrices This initial section will describe an approach using the inverse generating function (IGF) for Toeplitz matrices, by way of introduction. It will be appreciated that the same method works almost identically for multi-level Toeplitz matrices, such as BTTB matrices. For the BTTB case, the main difference is that the generating function will be bivariate.

In many applications, a generating function is given and from this, the corresponding Toeplitz or BTTB matrix is computed. Computing the inverse of the two-level Toeplitz matrix generated by f(x,y) is expensive and therefore should be avoided. In the approach described here, the inverse 1/f of the generating function and then the Toeplitz matrix T[1/f] generated by inverse 1/f can be computed. It can be shown that this matrix T[1/f] is a good approximation of $T[f]^{-1}$ if certain conditions are met.

This IGF approach works in three steps, if the computation of the generating function f from (input) Toeplitz matrix T[f] is included:

A) Determining the generating function f from (input) Toeplitz matrix T[f].
B) Computing the inverse of f (that is computing 1/f).
C) Computing the Toeplitz matrix T[1/f] generated by 1/f.

Figure 12:
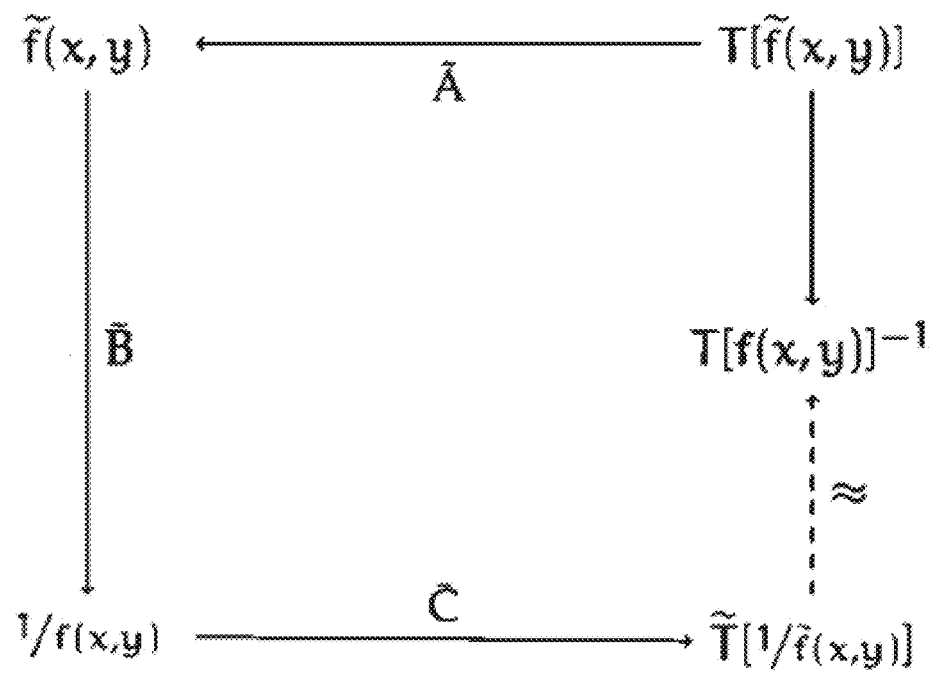
FIG. 12 is a flow diagram depicting an inverse generating function approach of designing a preconditioner for Toeplitz and BTTB matrices.

In the next sections, the required steps A to C for the IGF approach, will be replaced, with numerical alternatives Ã and C̃ as illustrated in FIG. 12. This is necessary in cases when the analytical way cannot be used or is too computationally expensive. In the relevant cases, all three alternatives should be applied, in order to implement this approach. Note that all the suggested alternatives can be computed efficiently, with the use of the FFT.

The starting point of the IGF method is the Toeplitz matrix T[f]. In FIG. 12, the numerical alternative Ã to step A becomes:

Ã) Approximate the (actual) generating function, with a function $\tilde{f}$, using the matrix elements.

This can be done in a variety of ways, the most straightforward way being:

$$\tilde{f} = \sum_{k=-(N_x-1)}^{N_x-1} t_k e^{ikx} \tag{2-1}$$

for an $N_x \times N_x$ (one level) Toeplitz matrix. This approach can be easily generalized to BTTB and other multilevel Toeplitz matrices. Computing the approximation $\tilde{f}$ is equivalent to:

$$\tilde{f} = \mathcal{D}_{N_x-1} * f \tag{2-2}$$

where $\mathcal{D}_{N_x-1}$ denotes the Dirichlet kernel of order $N_x-1$ and f the exact generating function. Alternative kernels, such as those having the specific form $$\tilde{f} = \mathcal{K} * f = \sum_{k=-(N_x-1)}^{N_x-1} b_k e^{ikx} \tag{2-3}$$

for some coefficients $b_k$, (e.g. the Fejér kernel) may instead be used.

If the kernel is of the form described above, then $\tilde{f}$ can be computed using an FFT in $\mathcal{O}(N_x \log N_x)$ operations.

In general, the Fourier coefficients of 1/f cannot be computed analytically, which is why a numerical alternative (step C̃) is described in this section. In order to determine the elements of T[1/f], the following integral (in the simple one level Toeplitz case) may be computed:

$$\frac{1}{2\pi}\int_{-\pi}^{\pi} \frac{1}{f(x)} e^{-ikx} dx \tag{2-4}$$

Instead of an analytical integration, this can be transformed using the rectangular (also called mid-point) rule, into a numerical integration, that requires only point evaluations of (x):

$$\frac{1}{sN_x} \sum_{j=0}^{sN_x-1} \frac{1}{f(2\pi j/sN_x - \pi)} e^{-ik(2\pi j/sN_x - \pi)} \tag{2-5}$$

where s is the sampling rate of the rectangular rule. In general, more accurate (and more complicated) methods of numerical integration could be applied, such as higher order Newton-Cotes formulae.

For the rectangular rule, the numerical integration step can again be computed using the FFT of order $sN_x$.

Sometimes the generating function f is not given explicitly, but only allows for computationally efficient function evaluations. However, if both numerical alternatives Ã and C̃ described above are used, function evaluations are sufficient to compute T[1/f] (see FIG. 12). Therefore, it is possible to change Equation (2-1) above to $$\tilde{f}_{grid}(\tilde{x}_j) = \sum_{k=-(n-1)}^{n-1} t_k e^{ik\tilde{x}_j} \tag{2-6}$$

where $\tilde{x}_j=(2\pi j/sn-\pi)$ is one of the sampling points. $\tilde{f}_{grid}$ can then be used in place of $\tilde{f}$ in FIG. 12. Thus, $1/\tilde{f}_{grid}$ can be computed by inverting pointwise (step B̃), and be used in Equation (2-5).

Besides being a good approximation, the preconditioner also should fulfill the conditions regarding the computationally efficient inversion and MVP. The first condition is satisfied, since no inverse needs to be computed. All the steps of the inverse generating function method can be computed efficiently using FFT. A further condition requires an efficient MVP with T[1/f], which is satisfied trivially since it has the same structure as T[f] and therefore the same costs in an MVP. For a BTTB matrix with $N_y \times N_y$ blocks, each of size $N_x \times N_x$, the costs for an MVP are $\mathcal{O}(N_x N_y \log N_x N_y)$.

Inverse Generating Function Preconditioner for BTTB-Block Matrices and Similar

Now the IGF approach will be generalized to (multi-level) Toeplitz-block matrices such as BTTB-block matrices. Consider first a matrix valued generating function F(s):

$$F(s) = \begin{pmatrix} f^{11}(s) & f^{12}(s) & \ldots & f^{1N}(s) \\ f^{21}(s) & f^{22}(s) & \ddots & \vdots \\ \vdots & \vdots & \ddots & \vdots \\ f^{N1}(s) & f^{N2}(s) & \ldots & f^{NN}(s) \end{pmatrix} \quad (2\text{-}8)$$

associate it with the corresponding Toeplitz-block matrix T[F(s)] generated by F(s):

$$T[F(s)] = \begin{pmatrix} T[f^{11}(s)] & T[f^{21}(s)] & \ldots & T[f^{1N}(s)] \\ T[f^{21}(s)] & T[f^{22}(s)] & \ddots & \vdots \\ \vdots & \vdots & \ddots & \vdots \\ T[f^{N1}(s)] & T[f^{N2}(s)] & \ldots & T[f^{NN}(s)] \end{pmatrix} \quad (2\text{-}9)$$

The matrix-valued inverse generating function $F^{-1}(s)$ (if an inverse exists) can be defined, and $T[F^{-1}]$ can be used as a preconditioner, using a method analogous to that described above in relation to BTTB matrices. Note that in the above definition T[F(s)] denotes a Toeplitz-block matrix. However T[F(s)] could also refer to a block-Toeplitz matrix. Both definitions are similar, since they are a result of a permutation. Therefore, the results described here also apply to standard block-Toeplitz matrices, and vice-versa. Such a method will now be described, with relation to FIG. 13.

Figure 13:
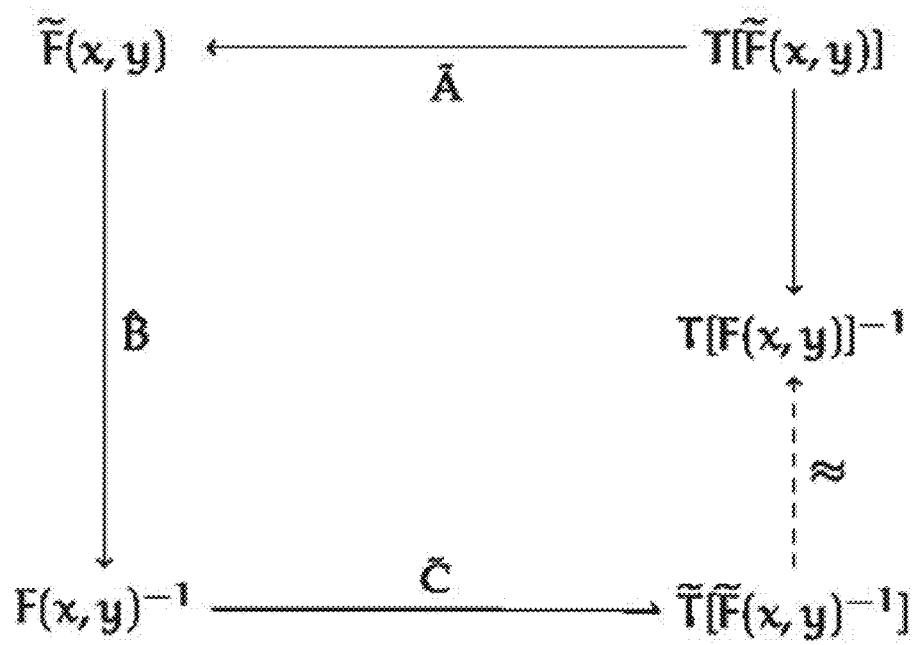
FIG. 13 is a flow diagram depicting an inverse generating function approach of designing a preconditioner for BTTB-block matrices in accordance with an embodiment of the invention.

In a first main embodiment, the designing of the preconditioner comprises the following steps:
 a) Provide an input matrix (input system), such as matrix C for example,
 b) For each non-zero top-level block of matrix C (i.e., the blocks along the diagonal, each comprising a BTTB-block matrix), determine the number of second-level blocks N×N (for example 3×3), where each second level block comprises a BTTB matrix.
 c) Calculate a generating function $f^{nm}$, 1≤n, m≤N, per second-level block (e.g., using the approximation of Equation (2-1) generalized for BTTB matrices), the generating function being created as a Fourier series, the elements of the second-level block being the Fourier coefficients,
 d) Provide a matrix valued generating function F(x,y) or (or approximated equivalent $\tilde{F}(x,y)$), having the dimensions N×N, and whereby each element of this matrix is a generating function $f^{nm}$ determined in step c)-steps c) and d) correspond to step $\tilde{A}$ of FIG. 13,
 e) Perform an inverse of matrix F(x,y) or $\tilde{F}(x,y)$, to calculate a matrix $F(x,y)^{-1}$ (step $\tilde{B}$),
 f) Use each element of $F(x,y)^{-1}$ as a generating function, and calculate from it a matrix $\tilde{T}[\tilde{F}(x,y)^{-1}]$ via an inverse Fourier transform or numerical integration (step $\tilde{C}$),
 g) Provide a preconditioner whereby each non-zero block is the matrix calculated at step f). The preconditioner may be arranged as a block-diagonal matrix, having a similar form as matrix C.

Applying the inversion formulas for the matrix-valued generating function F(x,y) or $\tilde{F}(x,y)$, requires the inversion of some of its elements. As discussed in the previous section, the inversion of the elements $f^{nm}$ can be performed point-wise after approximation with $\tilde{f}^{nm}$, using the Fourier coefficients extracted from the original matrix.

However, if $f^{nm}$ is close to zero at some point x, the inverse $f^{nm-1}$ will be very large at this point. The fact that the generating function can be only approximated can reinforce this fact, producing unrealistically high values for the inverse generating function. To counteract this effect, in an embodiment, the inverse generating function method can be applied on a regularized function, e.g., applied on $T[F+\alpha I_M]$. This is equivalent to applying it onto $T[F]+\alpha I_{m \times n}$. The optimal value for α corresponds to a trade-off which can be different for each linear system. As such, selection of an appropriate value for α can reduce the number of iterations.

Kroneker Product Approximated Preconditioner

The Kronecker product approximation refers to finding the optimal matrices $A_k$ and $B_k$ such that the sum of their Kronecker products is as close as possible to the desired matrix. This is equivalent to solving:

$$\min_{A_k \in \mathbb{C}^{N_x \times N_x}, B_k \in \mathbb{C}^{N_y \times N_y}} \left\| M - \sum_{k=1}^{s} A_k \otimes B_k \right\|_F \quad (3\text{-}1)$$

where ⊗ denotes the Kronecker product of two matrices and M is any matrix of the size $N_x N_y \times N_x N_y$.

Using this (approximate) decomposition into Kronecker products, the MVP of its inverse and a vector can be computed more efficiently, if additional approximations are applied. The preconditioner obtained by computing its Kronecker product approximation will be denoted by $\text{Kron}_s(T)$, where s indicates the number of Kronecker product terms used in the approximation and T refers to the original matrix.

The next section describes an efficient way to obtain the Kronecker product approximation for BTTB matrices and how one can use this decomposition to compute the inverse efficiently from the computational point of view. Following this, possible ways to use this approach in the case of a 3×3 BTTB-block matrix will be described, thus generalizing the approach to make it applicable to the full problem.

Optimal Approximation for BTTB Matrices

It can be shown that if the approximated matrix is BTTB (M=$T_{(BTTB)}$), then the minimization problem (3-1) above is equivalent to:

$$\min_{A_k \in \mathcal{T}^{N_x}, B_k \in \mathcal{T}^{N_y}} \left\| T_{(BTTB)} - \sum_{k=1}^{s} A_k \otimes B_k \right\|_F \quad (3\text{-}2)$$

where $\mathcal{T}^n$ denotes the class of Toeplitz matrices of size n×n. In other words, the optimal $A_k$ and $B_k$ have the same structure as $T_{(BTTB)}$, but reduced to one-level.

It is known that a tilde-transformation can be defined which rearranges block matrices in the following way:

$$\tilde{T} = \text{tilde}(T) = \text{tilde}\begin{pmatrix} T_{1,1;} & T_{1,2;} & \cdots & T_{1,n;} \\ T_{2,1;} & T_{2,2;} & \cdots & T_{2,n;} \\ \vdots & \vdots & \ddots & \vdots \\ T_{n,1;} & T_{n,2;} & \cdots & T_{n,n;} \end{pmatrix} = \begin{pmatrix} vec(T_{1,1;})^T \\ \vdots \\ vec(T_{2,1;})^T \\ \vdots \\ vec(T_{1,n;})^T \\ \vdots \\ vec(T_{n,n;})^T \end{pmatrix} \quad (3-3)$$

where the operator vec(A) unrolls a matrix into a vector by "stacking" its columns from left to right. Due to the transpose operations on the right-hand side components, the resulting overall expression is a matrix. This can be reformulated into:

$$\min_{\tilde{a}_k, \tilde{b}_k} \left\| \tilde{T}_{(BTTB)} - \sum_{k=1}^{s} (\tilde{a}_k \tilde{b}_k^T) \right\|_F \quad (3-4)$$

This problem can be solved by computing the singular value decomposition (SVD) of $\tilde{T} = \Sigma_{k=1}^{r}(\tilde{\sigma}_k \tilde{u}_k \tilde{v}_k^H)$ and taking the first s terms. However the cost of this would be too high to be practical. Instead, the problem may be condensed into a smaller problem:

$$\min_{a_k, b_k} \left\| \tilde{R}_{L1} P \tilde{R}_{R1}^T - \sum_{k=1}^{s} (\tilde{R}_{L1} a_k)(b_k^T \tilde{R}_{R1}^T) \right\|_F = \min_{a_k, b_k} \left\| \hat{P} - \sum_{k=1}^{s} (\tilde{a}_k \tilde{b}_k^T) \right\|_F \quad (3-5)$$

where:
P is a $(2N_x-1) \times (2N_y-1)$ matrix containing all the Fourier coefficients, present in the BTTB matrix $\tilde{T}_{(BTTB)}$, $$\tilde{R}_{L1} = \frac{1}{\sqrt{N_x}} \text{diag}\Big(\sqrt{1}, \sqrt{2}, \ldots, \quad (3-6)$$

$$\sqrt{N_x-1}, \sqrt{N_x}, \sqrt{N_x-1}, \ldots, \sqrt{2}, \sqrt{1}\Big), \text{ and}$$

$$\tilde{R}_{R1} = \frac{1}{\sqrt{N_y}} \text{diag}\Big(1, 2, \ldots, N_y-1, N_y, N_y-1, \ldots, 2, 1\Big)^{1/2}$$

Therefore, to summarize, the minimization (3-1) can be solved efficiently by the following steps:
  compute $\tilde{R}_{L1}$ and $\tilde{R}_{R1}$
  compute $\hat{P} = \tilde{R}_{L1} P \tilde{R}_{R1}^T$
  calculate SVD of $\hat{P} \leq \Sigma_{k=1}^{sr}(\sigma_k u v_k^H)$
  set $\hat{a}_k = \sqrt{\sigma_k} u_k$ and $\hat{b}_k = \sqrt{\sigma_k} v_k$
  solve $\tilde{R}_{L1} a_k = \hat{a}_k$ and $\tilde{R}_{R1} b_k = \hat{b}_k$
  build matrices $A_k$ and $B_k$ from $a_k$ and $b_k$ The last of these steps is performed by creating a Toeplitz matrix $A_k$, whose first row consist of the first $N_x$ elements of $a_k$. The first column of $A_k$ comprise the last $N_x$ elements of $a_k$. This is done analogously for $B_k$.

Inverse and MVP

To use the Kronecker product approximation as a preconditioner, the MVP with its inverse needs to be computable efficiently. In this section the case of s=1, i.e., an approximation with just one Kronecker product is described. Next, the case of s>1 terms is discussed, which requires further approximations for an efficient computation.

One term approximation—In this case, the BTTB matrix $T_{(BTTB)}$ is approximated with only a single term of the Kronecker product approximation, thus $$T_{(BTTB)} \approx A \otimes B \quad (3-7)$$

using the fact that $(A \otimes B)^{-1} = A^{-1} \otimes B^{-1}$:

$$(T_{(BTTB)})^{-1} x (A \otimes B)^{-1} x \quad (3-8)$$

It can also be demonstrated that the MVP with the inverse can be expressed as:

$$(A \otimes B)^{-1} x = (A^{-1} \otimes B^{-1}) x = vec(B^{-1} vec^{-1}(x) A^{-T}) \quad (3-9)$$

Consequently, the computation of an MVP with $(A \otimes B)^{-1}$ requires only the inverses of A and B separately. They can be computed utilizing, for example, the Gohberg-Semencul formula. This way, the inverses are given as four Toeplitz matrices, i.e., $T^{-1} = AB+CD$, where A, B, C and D are Toeplitz. These two matrix-matrix products can then be computed by computing multiple MVPs with Toeplitz matrices.

Multiple terms approximation—In general, no exact inversion formulas exist for $\Sigma_{k=1}^{s} A_k \otimes B_k$ for s>1. One approximation approach is described below. Given the SVD of $A_1 = U_A S_A V_A^H$ and $B_1 = U_B S_B V_B^H$, the following are constructed:

$$U = U_A \otimes U_B \quad (3-10)$$

$$V = V_A \otimes V_B \quad (3-11)$$

$$S = \text{diag}\left( U^H \left( \sum_{k=1}^{s} A_k \otimes B_k \right) V \right) \quad (3-12)$$

then:

$$\Sigma_{k=1}^{s} A_k \otimes B_k \approx U S V^H. \quad (3-13)$$

It can be seen that S satisfies:

$$\min_{\Sigma \in D} \left\| \Sigma - U^H \left( \sum_{k=1}^{s} A_k \otimes B_k \right) V \right\| = \min_{\Sigma \in D} \left\| U^H \Sigma V - \left( \sum_{k=1}^{s} A_k \otimes B_k \right) \right\| \quad (3-14)$$

where $D$ denotes the class of all diagonal matrices. This shows that the described method produces an optimal SVD approximation given the fixed basis U and V. Additionally, for s=1, it returns the regular SVD, without any further approximation. The MVP with its inverse can then be computed by $$T_{(BTTB)}^{-1} x \approx \left( \sum_{k=1}^{s} A_k \otimes B_k \right)^{-1} \approx (USV^H)^{-1} x = \quad (3-15)$$

$$(V_A \otimes V_B) S^{-1} (U_A^H \otimes U_B^H) x$$

BTTB-Block Matrices

Considering now Kronecker product approximation for BTTB-block matrices, in a second main embodiment, the designing of the preconditioner comprises: (A) Providing an input matrix (input system), such as matrix C for example; (B) For each non-zero top-level block of matrix C (i.e., the blocks along the diagonal, each comprising a BTTB-Block matrix), determine the number of second-level blocks N×N (for example 3×3), where each second level block comprises a BTTB matrix; (C) Providing a preconditioner for each second-level block, for example by applying the steps described previously herein, and forming a matrix K consisting of the calculated preconditioner for each block, the matrix K having the same dimension as each non-zero top-level block of matrix C (3×3 in this example); (D) Providing a first partition of the matrix K into four blocks; (E) Using the block inversion formula to approximate the inverse, whereby terms detrimental to the computationally efficient structure of the matrix are neglected; (F) Repeating steps D) and E) for smaller and smaller blocks until the obtained blocks coincide in size with the second-level blocks in step B); and (G) Selecting the partitioning with the dimension most efficient for computation.

Steps A) and B) are equivalent to steps a) and b) in the IGF embodiment described above.

Step C) may comprise using a minimization such as that described above for a BTTB approximated matrix to determine the matrix K. For BTTB-Block matrix K, each of the 3×3 elements (i.e., each BTTB block) is approximated by the sum of its Kronecker products:

$$K = \begin{pmatrix} T_{1,1;} & T_{1,2;} & T_{1,3;} \\ T_{2,1;} & T_{2,2;} & T_{2,3;} \\ T_{3,1;} & T_{3,2;} & T_{3,3;} \end{pmatrix} = \qquad (3-16)$$

$$\begin{pmatrix} \sum_{k=1}^{s} A_{1,1;k} \otimes B_{1,1;k} & \sum_{k=1}^{s} A_{1,2;k} \otimes B_{1,2;k} & \sum_{k=1}^{s} A_{1,3;k} \otimes B_{1,3;k} \\ \sum_{k=1}^{s} A_{2,1;k} \otimes B_{2,1;k} & \sum_{k=1}^{s} A_{2,2;k} \otimes B_{2,2;k} & \sum_{k=1}^{s} A_{2,3;k} \otimes B_{2,3;k} \\ \sum_{k=1}^{s} A_{3,1;k} \otimes B_{3,1;k} & \sum_{k=1}^{s} A_{3,2;k} \otimes B_{3,2k} & \sum_{k=1}^{s} A_{3,3;k} \otimes B_{3,3;k} \end{pmatrix}$$

Steps D, E and F describe how the inverse $K^{-1}$ of matrix K may be approximated practically. This may be done by using recursive block inversion techniques, whereby the matrix K is divided into four blocks in a 2×2 block matrix arrangement. This is then inverted (approximately) at the block level until the BTTB block level is reached. In the example here, where K is a 3×3 matrix, this recursive approach will comprise two stages or iterations.

By way of specific example, matrix K may be divided as follows:

$$K = \begin{pmatrix} W & Q \\ R & S \end{pmatrix} \qquad (3-17)$$

where:

$$W = \begin{pmatrix} T_{1,1;} & T_{1,2;} \\ T_{2,1;} & T_{2,2;} \end{pmatrix}$$

$$Q = \begin{pmatrix} T_{1,3;} \\ T_{2,3;} \end{pmatrix}$$

$$R = (T_{3,1;} \; T_{3,2;})$$

$$S = (T_{3,3;})$$

and by applying the block inversion formula:

$$K^{-1} = \begin{pmatrix} W & Q \\ R & S \end{pmatrix}^{-1} = \begin{pmatrix} W^{-1} + W^{-1}QZRW^{-1} & W^{-1}QZ \\ -ZRW^{-1} & Z \end{pmatrix} \qquad (3-18)$$

where $$Z = (S - RW^{-1}Q)^{-1}$$

The inverse $W^{-1}$ can be computed by applying the block inversion formula again, this time on W, thus:

$$W^{-1} = \begin{pmatrix} T_{1,1;} & T_{1,2;} \\ T_{2,1;} & T_{2,2;} \end{pmatrix}^{-1} \qquad (3-19)$$

$$= \begin{pmatrix} T_{1,1;}^{-1} + T_{1,1;}^{-1}T_{1,2;}Z'T_{2,1;}T_{1,1;}^{-1} & T_{1,1;}^{-1}T_{1,2;}Z' \\ -Z'T_{2,1;}T_{1,1;}^{-1} & Z' \end{pmatrix}$$

where $$Z' = (T_{2,2;} - T_{2,1;}T_{1,1;}^{-1}T_{1,2;})^{-1}$$

This means that Z and Z' have to be computed (in addition to $T_{1,1;}^{-1}$ which may be computed as described in the previous section) in order to compute the inverse of a BTTB-block matrix. However, this cannot be done efficiently without further approximations. Therefore, terms detrimental to the computationally efficient structure of the matrix are neglected.

The problem of computing Z and Z' is separated into two different cases. In the first case s=1, the approximation is only a single Kronecker product, while in the second case s>1 the approximation consists of a sum of Kronecker products.

One Term Approximation
Sum Approximation
If s=1, then $$Z' = (A_{2,2;} \otimes B_{2,2;} - A_{2,1;} \otimes B_{2,1;} \cdot A_{1,1;}^{-1} \otimes B_{1,1;}^{-1} \cdot A_{1,2;} \otimes B_{1,2;})^{-1} = (A_{2,2;} \otimes B_{2,2;} - (A_{2,1;}A_{1,1;}^{-1}A_{1,2;}) \otimes (B_{2,1;} \otimes B_{1,1;}^{-1}B_{1,2;}))^{-1} \qquad (3\text{-}20)$$

However, this is the inverse of a sum of Kronecker products which cannot be computed efficiently. Therefore, a possible approach is to approximate the sum occurring in Z' by just the first term, thus $$Z' \approx A_{2,2;}^{-1} \otimes B_{2,2;}^{-1} \qquad (3\text{-}21)$$

Analogously, for Z, a similar approximation can be made:

$$Z' \approx A_{3,3;}^{-1} \otimes B_{3,3;}^{-1} \qquad (3\text{-}22)$$

Using this approximation, the elements of $W^{-1}$ are $$(W^{-1})_{1,1} = A_{1,1;}^{-1} \otimes B_{1,1;}^{-1} + (A_{1,1;}^{-1}A_{1,2;}A_{2,2;}^{-1}A_{2,1;} A_{1,1;}^{-1}) \otimes (B_{1,1;}^{-1}B_{1,2;}B_{2,2;}^{-1}B_{2,1;}B_{1,1;}^{-1})$$
$$(W^{-1})_{1,2} = (A_{1,1;}^{-1}A_{1,2;}A_{2,2;}^{-1}) \otimes (B_{1,1;}^{-1}B_{1,2;} B_{2,2;}^{-1}) \qquad (W^{-1})_{2,1} = (-A_{2,2;}^{-1}A_{2,1;}A_{1,1;}^{-1}) \otimes (B_{2,2;}^{-1}B_{2,1;}B_{1,1;}^{-1}) \quad (W^{-1})_{2,2} = A_{2,2;}^{-1} \otimes B_{2,2;}^{-1} \qquad (3\text{-}23)$$

The same approximation and inversion formula can be applied again to find the inverse of matrix K. The elements of $K^{-1}$ can be found in the corresponding section of the appendix.

As such, using the approximations Z and Z' described above, $K^{-1}$ can be computed using only inverses of BTTB matrices. The MVP can be computed using one of two strategies. A first option is to precompute the matrix-matrix products in the equations above. For example, considering element $(K^{-1})_{3,2}$:

$$(K^{-1})_{3,2} = \underbrace{(A_{3,3}^{-1}; A_{3,1}; A_{1,1}^{-1}, A_{1,2}; A_{2,2}^{-1};)}_{\tilde{A}_1} \otimes \underbrace{(B_{3,3}^{-1}; B_{3,1}; B_{1,1}^{-1}; B_{1,2}; B_{2,2}^{-1};)}_{\tilde{B}_1} + \quad (3-24)$$

$$\underbrace{(A_{3,3}^{-1}; A_{3,2}; A_{2,2}^{-1};)}_{\tilde{A}_2} \otimes \underbrace{(B_{3,3}^{-1}; B_{3,2}; B_{2,2}^{-1};)}_{\tilde{B}_2} = \tilde{A}_1 \otimes \tilde{B}_1 + \tilde{A}_2 \otimes \tilde{B}_2$$

If this strategy is used, it is necessary to use the detailed formula described in the appendix. This option reduces the number of matrix-matrix products that have to be computed. However, the Toeplitz structures of the matrices in the original equation will be lost. Therefore the complexity will be $\mathcal{O}(N_x^2 N_y + N_x N_y^2)$.

For the second option, the equations will be left untouched, preserving the Toeplitz structure of the matrices involved. This would require a fairly large number of matrix-matrix products, but each can be sped up using the FFT in combination with the Gohberg-Semencul formula. The complexity in this case is $\mathcal{O}(N_x N_y \log N_y + N_y N_x \log N_x)$, but with a fairly large constant, depending on the number of matrices in the expression.

Diagonal Approximation

Another approach would be to approximate the highest level (e.g., 3×3-block level) with a block diagonal matrix, i.e., $$K = \begin{pmatrix} T_{1,1}; & T_{1,2}; & T_{1,3}; \\ T_{2,1}; & T_{2,2}; & T_{2,3}; \\ T_{3,1}; & T_{3,2}; & T_{3,3}; \end{pmatrix} \approx \begin{pmatrix} T_{1,1}; & 0 & 0 \\ 0 & T_{2,2}; & 0 \\ 0 & 0 & T_{3,3}; \end{pmatrix} \quad (3-25)$$

The inverse is then simply:

$$K^{-1} \approx \begin{pmatrix} T_{1,1}^{-1}; & 0 & 0 \\ 0 & T_{2,2}^{-1}; & 0 \\ 0 & 0 & T_{3,3}^{-1}; \end{pmatrix} \quad (3-26)$$

The MVP with $K^{-1}$ can be computed efficiently if the Gohberg-Semencul formula is utilized. The cost of an MVP is then $\mathcal{O}(N_x N_y \log N_y + N_y N_x \log N_x)$, with a smaller constant compared to the previous method.

Multiple Term Approximation

In the case of s>1, each BTTB matrix will be approximated via an approximate SVD, so $T_{i,j} \approx U_{i,j} S_{i,j} V_{i,j}^H$.

Sum Approximation

Using the same approximations for Z and Z' as described for the single term approximation:

$$(W^{-1})_{1,1} = V_{1,1} S_{1,1;}^{-1} U_{1,1;}^H + V_{1,1} S_{1,1;}^{-1} U_{1,1;}^H U_{1,2} S_{1,2;} \\
V_{1,2;}^H V_{2,2} S_{2,2;}^{-1} U_{2,2;}^H U_{2,1} S_{2,1;} V_{2,1;}^H V_{1,1;} \\
S_{1,1;}^{-1} U_{1,1;}^H (W^{-1})_{1,2} = V_{1,1} S_{1,1;}^{-1} U_{1,1;}^H U_{1,2} S_{1,2;} \\
V_{1,2;}^H V_{2,2} S_{2,2;}^{-1} U_{2,2;}^H \quad (W^{-1})_{2,1} = V_{2,2} S_{2,2;}^{-1} \\
U_{2,2;}^H U_{2,1} S_{2,1;} V_{2,1;}^H V_{1,1} S_{1,1;}^{-1} U_{1,1;}^H \\
(W^{-1})_{2,2} = V_{2,2} S_{2,2;}^{-1} U_{2,2;}^H \quad (3-27)$$

for the elements of $W^{-1}$. The elements of $K^{-1}$ are given in the corresponding section of the appendix.

Common Basis

In another approach, all BTTB matrices $T_{i,j}$ could be diagonalized by common basis matrices U and V. Then $T_{i,j} \approx U S_{i,j} V^H$ and no approximations for Z and Z' are needed, since they can be computed easily by:

$$Z = (U(S_{2,2;} - S_{2,1;} S_{1,1;}^{-1} S_{1,2;}) V^H)^{-1} := V S_{z;}^{-1} U^H \quad Z' = (U(S_{2,2;} - S_{2,1;} S_{1,1;}^{-1} S_{1,2;}) V^H)^{-1} := V S_{z';}^{-1} U^H \quad (3-28)$$

Using a common basis, the elements of $W^{-1}$ are $$(W^{-1})_{1,1} = V(S_{1,1;}^{-1} + S_{1,1;}^{-1} S_{1,2;} S_{z;}^{-1} S_{2,1;} S_{1,1;}^{-1}) U^H \\
(W^{-1})_{1,2} = V(S_{1,1;}^{-1} + S_{1,1;}^{-1} S_{1,2;} S_{z;}^{-1}) U^H \\
(W^{-1})_{2,1} = V(-S_{z;}^{-1} S_{2,1;} S_{1,1;}^{-1}) U^H \quad (W^{-1})_{2,2} = V(-S_{z;}^{-1}) U^H \quad (3-28)$$

and ultimately, the elements for $K^{-1}$ are:

$$(K^{-1})_{1,1} = V(S_{1,1;}^{-1} + S_{1,1;}^{-1} S_{1,2;} S_{z';}^{-1} S_{2,1;} S_{1,1;}^{-1} + \\
S_{1,1;}^{-1} S_{1,3;} S_{z;}^{-1} S_{3,2;} S_{1,1;}^{-1} + S_{1,1;}^{-1} S_{1,3;} S_{z;}^{-1} S_{3,2;} \\
S_{1,1;}^{-1} S_{1,2;} S_{z';}^{-1} S_{2,1;} S_{1,1;}^{-1} + S_{1,1;}^{-1} S_{1,2;} S_{z';}^{-1} S_{2,1;} \\
S_{1,1;}^{-1} S_{1,3;} S_{z;}^{-1} S_{3,2;} S_{1,1;}^{-1} + S_{1,1;}^{-1} S_{1,2;} S_{z';}^{-1} S_{2,1;} \\
S_{1,1;}^{-1} S_{1,3;} S_{z;}^{-1} S_{3,2;} S_{1,1;}^{-1} S_{1,2;} S_{z';}^{-1} S_{2,1;} S_{1,1;}^{-1} \\
- S_{1,1;}^{-1} S_{1,3;} S_{z;}^{-1} S_{3,2;} S_{z';}^{-1} S_{2,1;} S_{1,1;}^{-1} - S_{1,1;}^{-1} S_{1,2;} \\
S_{z';}^{-1} S_{2,1;} S_{1,1;}^{-1} S_{1,3;} S_{z;}^{-1} S_{3,2;} S_{z';}^{-1} S_{2,1;} S_{1,1;}^{-1} + \\
S_{1,1;}^{-1} S_{1,2;} S_{z';}^{-1} S_{2,1;} S_{1,1;}^{-1} S_{1,3;} S_{z;}^{-1} S_{3,1;} S_{1,1;}^{-1} + \\
S_{1,1;}^{-1} S_{1,2;} S_{z';}^{-1} S_{2,3;} S_{z;}^{-1} S_{3,1;} S_{1,1;}^{-1} S_{1,2;} S_{z';}^{-1} S_{2,1;} \\
S_{1,1;}^{-1} - S_{1,1;}^{-1} S_{1,2;} S_{z';}^{-1} S_{2,3;} S_{z;}^{-1} S_{3,1;} S_{z';}^{-1} S_{2,1;} \\
S_{1,1;}^{-1}) U^H (K^{-1})_{1,2} = V(S_{1,1;}^{-1} + S_{1,2;} S_{z';}^{-1} + S_{1,1;}^{-1} \\
S_{1,3;} S_{z;}^{-1} S_{3,1;} S_{1,1;}^{-1} S_{1,2;} S_{z';}^{-1} + S_{1,1;}^{-1} S_{1,2;} S_{z';}^{-1} \\
S_{2,1;} S_{1,1;}^{-1} S_{1,3;} S_{z;}^{-1} S_{3,1;} S_{1,1;}^{-1}; S_{1,2;} S_{z';}^{-1} + S_{2,1;} \\
S_{1,1;}^{-1} S_{1,3;} S_{z;}^{-1} S_{3,2;} S_{z';}^{-1} + S_{1,1;}^{-1} S_{1,2;} S_{z';}^{-1} S_{2,1;} \\
S_{1,1;}^{-1} S_{1,3;} S_{z;}^{-1} S_{3,2;} S_{z';}^{-1} + S_{1,1;}^{-1} S_{1,2;} S_{z';}^{-1} S_{2,3;} \\
S_{z;}^{-1} S_{3,1;} S_{1,1;}^{-1} S_{1,2;} S_{z';}^{-1} + S_{1,1;}^{-1} S_{1,2;} S_{z';}^{-1} S_{2,3;} \\
S_{z;}^{-1} S_{3,2;} S_{z';}^{-1}) U^H$$

$$(K^{-1})_{1,3} = V(S_{1,1;}^{-1} S_{1,3;} S_{z;}^{-1} + S_{1,1;}^{-1} S_{1,2;} S_{z';}^{-1} S_{2,1;} S_{1,1;}^{-1} S_{1,3;} S_{z;}^{-1} + S_{1,1;}^{-1} S_{1,2;} S_{z';}^{-1} S_{2,3;} S_{z;}^{-1}) U^H$$

$$(K^{-1})_{2,1} = V(S_{z';}^{-1} S_{2,1;} S_{1,1;}^{-1} + S_{z';}^{-1} S_{2,1;} S_{1,1;}^{-1} S_{1,3;} \\
S_{z;}^{-1} S_{3,1;} S_{1,1;}^{-1} - S_{z';}^{-1} S_{2,1;} S_{1,1;}^{-1} S_{1,3;} S_{z;}^{-1} S_{3,1;} \\
S_{1,1;}^{-1} S_{z';}^{-1} S_{2,1;} S_{1,1;}^{-1} + S_{z';}^{-1} S_{2,1;} S_{1,1;}^{-1} S_{1,3;} S_{z;}^{-1} \\
S_{3,2;} S_{z';}^{-1} S_{2,1;} S_{1,1;}^{-1} + S_{z';}^{-1} S_{2,3;} S_{z;}^{-1} S_{3,1;} \\
S_{1,1;}^{-1} + S_{z';}^{-1} S_{2,3;} S_{z;}^{-1} S_{3,1;} S_{1,1;}^{-1} S_{1,2;} S_{z';}^{-1} S_{2,1;} \\
S_{1,1;}^{-1} - S_{z';}^{-1} S_{2,3;} S_{z;}^{-1} S_{3,2;} S_{z';}^{-1} S_{2,1;} S_{1,1;}^{-1}) U^H$$

$$(K^{-1})_{2,3} = V(S_{z';}^{-1} S_{2,1;} S_{1,1;}^{-1} S_{1,3;} S_{z;}^{-1} + S_{z';}^{-1} S_{2,3;} S_{z;}^{-1}) U^H$$

$$(K^{-1})_{3,1} = V(S_{z;}^{-1} S_{3,1;} S_{1,1;}^{-1} + S_{z;}^{-1} S_{3,1;} S_{1,1;}^{-1} S_{1,2;} \\
S_{z';}^{-1} S_{2,1;} S_{1,1;}^{-1} - S_{z;}^{-1} S_{3,2;} S_{z';}^{-1} S_{2,1;} S_{1,1;}^{-1}) U^H$$

$$(K^{-1})_{3,2} = V(S_{z;}^{-1} S_{3,1;} S_{1,1;}^{-1} S_{1,2;} S_{z';}^{-1} + S_{z';}^{-1} S_{3,2;} S_{z';}^{-1}) U^H$$

$$(K^{-1})_{3,3} = V(S_{z;}^{-1}) U^H \quad (3-29)$$

The complexity of this approach depends heavily on the basis matrices U and V.

Diagonal Approximation

Analogously to the diagonal approximation in the one term case, $K^{-1}$ can be approximated with a block diagonal matrix on the highest level.

Embodiments of the present invention may be implemented in accordance with the reconstruction methods described with reference to FIGS. 5 and 6 to provide a method of reconstructing an approximate structure of an object from a detected electromagnetic scattering property arising from illumination of the object by radiation.

Embodiments of the present invention may be implemented by implementing the methods described herein on the processing units PU described with reference to FIGS. 3 and 4 to provide an inspection apparatus for reconstructing an approximate structure of an object.

The processors described with reference to FIG. 3 or 4 may operate under the control of computer programs containing one or more sequences of machine-readable instructions for calculating electromagnetic scattering properties of a structure, the instructions being adapted to cause one or more processors to perform the methods described herein.

Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The methods according to embodiments of the present invention described above may be incorporated into the forward diffraction model for reconstructing an approximate structure of an object (not limited to 1D-periodic) from a detected electromagnetic scattering property, such as a diffraction pattern, arising from illumination of the object by radiation, as described above with reference to FIGS. 5 and 6. The processing unit PU described above with reference to FIGS. 3 and 4 may be configured to reconstruct an approximate structure of an object using this method.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "electromagnetic" encompasses electric and magnetic.

The term "electromagnetic scattering properties" encompasses reflection and transmission coefficients and scatterometry measurement parameters including spectra (such as intensity as a function of wavelength), diffraction patterns (intensity as a function of position/angle) and the relative intensity of transverse magnetic- and transverse electric-polarized light and/or the phase difference between the transverse magnetic- and transverse electric-polarized light. Diffraction patterns themselves may be calculated for example using reflection coefficients.

Thus, although embodiments of the present invention are described in relation to reflective scattering, the invention is also applicable to transmissive scattering.

The term "regularization" refers to a process of introducing additional information in order to solve an ill-posed problem or to prevent overfitting.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

Further embodiments according to the invention are further described in below numbered clauses:

1. A method for reconstructing a parameter of a lithographic process comprising the step of designing a preconditioner suitable for an input system comprising the difference of a first matrix and a second matrix, the first matrix being arranged to have a multi-level structure of at least three levels whereby at least two of said levels comprise a Toeplitz structure.

2. A method according to clause 1, wherein said first matrix relates to material property distribution in a transverse plane of a structure being measured.

3. A method according to clause 1 or 2, wherein said first matrix links an electric field related to a measurement of said structure with an associated auxiliary vector field.

4. A method according to clause 1, 2 or 3, wherein said second matrix comprises the product of a Green's function matrix and a contrast matrix representing the contrast between materials in said structure.

5. A method according to any preceding clause wherein, after permutation, said at least two levels which comprise a Toeplitz structure are the lowermost two levels.

6. A method according to any preceding clause, wherein said first matrix is arranged such that each block of the penultimate level comprises a BTTB structure.

7. A method according to clause 6, wherein said first matrix is arranged such that the level above said penultimate level comprises a BTTB-Block structure.

8. A method according to clause 7, wherein said BTTB-Block structure comprises a 3×3 BTTB-Block structure.

9. A method according to clause 7 or 8, wherein said first matrix is arranged such that the top most level of said multi-level structure comprises a Block-Diagonal structure.

10. A method according to clause 9, wherein said multi-level matrix structure comprises four levels.

11. A method according to clause 10, wherein said preconditioner comprises a Block-Diagonal matrix wherein each non-zero element comprises a Toeplitz-Block structure.

12. A method according to clause 11, wherein each non-zero element comprises a BTTB-block structure.

13. A method according to clause 11 or 12, wherein each non-zero element comprises a matrix generated from a matrix-valued inverse generating function.

14. A method according to clause 13, comprising the step of calculating a generating function per second-level block of said multi-level matrix structure, said generating function per second-level block being created as a Fourier series, the elements of the second-level block being the Fourier coefficients.

15. A method according to clause 14, comprising the steps of determining a matrix-valued generating function whereby each element of the matrix-valued generating function is the generating function per second-level block; and determining an inverse of each matrix-valued generating function to obtain said matrix-valued inverse generating function.

16. A method according to clause 15, wherein said step of performing determining an inverse of each matrix-valued generating function comprises performing a pointwise inversion 17. A method according to clause 15 or 16, comprising the step of using each matrix-valued inverse generating function to generate each non-zero element of the preconditioner.

18. A method according to clause 17, wherein said step of using each matrix-valued inverse generating function to generate each non-zero element of the preconditioner is performed by way of a numerical inversion.

19. A method according to clause 10, wherein the preconditioner is determined from an approximate decomposition of said first matrix into one or more Kronecker products.

20. A method according to clause 19, comprising the step of forming an intermediate matrix comprising for each block element, a Kronecker product approximation of the corresponding element of the first matrix.

21. A method according to clause 20, wherein said intermediate matrix has the same dimensions as each non-zero element of the first matrix.

22. A method according to clause 20 or 21, comprising the step of inverting the intermediate matrix using the block inversion formula.

23. A method according to clause 22, wherein said inversion comprises performing the steps of:
providing a first partition of the intermediate matrix into four blocks,
using the block inversion formula to approximate the inverse, and
repeating these steps for increasingly smaller blocks until the obtained blocks coincide in size with the non-zero blocks of the first matrix.

24. A method according to clause 22 or 23, wherein, during the step of inverting using the block inversion formula, terms detrimental to the computationally efficient structure of the matrix are neglected.

25. A method according to clause 24, comprising the step of approximating said intermediate matrix as a diagonal matrix, said neglected terms comprising non-diagonal terms of said intermediate matrix.

26. A method according to clause 24, comprising approximating the sum of Kronecker products when applying the block inversion formula for one or more elements of intermediate matrix.

27. A method according to clause 26, wherein one or more sums of Kronecker products which require evaluating are approximated by only their first term.

28. A method according to any of clauses 24 to 27, wherein said decomposition of said first matrix into one or more Kronecker products comprises an approximation into a single Kronecker product.

29. A method according to any of clauses 24 to 27, wherein said decomposition of said first matrix into one or more Kronecker products comprises an approximation into more than one Kronecker product.

30. A method according to clause 29, wherein each Kronecker product factor of each block element of the intermediate matrix is approximated by a singular value decomposition.

31. A method according to clause 30, wherein each block element of the intermediate matrix is diagonalized by common basis matrices.

32. A method according to any preceding clause, wherein the first matrix comprises an approximation in at least one of the at least two levels comprising a Toeplitz structure, said approximations comprising one or more elements being identity.

33. A method according to any preceding clause, further comprising:
numerically solving a volume integral equation for electromagnetic scattering for a plurality of modes in at least one lateral direction, wherein the integration is performed by solving a linear system of equations, each of which comprises a term based on said input system and each preconditioned by said preconditioner; and
calculating electromagnetic scattering properties of a structure defined in part by said parameter using results of the numerical solution.

34. A method according to clause 33, wherein the first matrix comprises a normal vector field matrix decomposed from the coefficient matrix of the linear system of equations.

35. A method of reconstructing an approximate structure of an object from a detected electromagnetic scattering property arising from illumination of the object by radiation, the method comprising the steps:
estimating said parameter of said structure;
determining at least one model electromagnetic scattering property from the parameter;
comparing the detected electromagnetic scattering property to the at least one model electromagnetic scattering property; and
determining an approximate object structure based on the result of the comparison,
wherein the model electromagnetic scattering property is determined using a method according to clause 33 or 34.

36. A method according to clause 35, further comprising the step of arranging a plurality of the model electromagnetic scattering properties in a library and the step of comparing comprises matching the detected electromagnetic scattering property to contents of the library.

37. A method according to clause 35 or clause 36, further comprising iterating the steps of determining at least one model electromagnetic scattering property, and comparing the detected electromagnetic scattering property wherein the parameter is revised based on the result of the step of comparing in a previous iteration.

38. A computer program product containing one or more sequences of machine-readable instructions for reconstructing a parameter, the instructions being adapted to cause one or more processors to perform a method according to any of clauses 1 to 32.

39. A computer program product containing one or more sequences of machine-readable instructions for calculating electromagnetic scattering properties of a structure, the instructions being adapted to cause one or more processors to perform a method according to any of clauses 33 to 37.

40. An inspection apparatus for reconstructing an approximate structure of an object, the inspection apparatus comprising:
an illumination system configured to illuminate the object with radiation;
a detection system configured to detect an electromagnetic scattering property arising from the illumination; and
a processor configured to reconstruct a parameter of said structure by performing the method of any of clauses 1 to 32.

41. An inspection apparatus according to clause 40, wherein said processor is further configured to:
estimate said parameter;
determine at least one model electromagnetic scattering property from the parameter;
compare the detected electromagnetic scattering property to the at least one model electromagnetic scattering property; and
determine an approximate object structure from a difference between the detected electromagnetic scattering property and the at least one model electromagnetic scattering property,
wherein the processor is configured to determine the model electromagnetic scattering property using a method according to any of clauses 33 to 37.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

APPENDIX

One Term Approximation
Sum Approximation
This section describes the elements of $K^{-1}$, if for a one term approximation-sum approximation described in the corresponding section above is used. The last step for each element of $K^{-1}$ should be performed if the MVP will be computed following the strategy of Equation (3-24)

$$(K^{-1})_{1,1}=(W^{-1})_{1,1}((W^{-1})_{1,1}T_{1,3}+(W^{-1})_{1,2}T_{2,3})T_{3,3}^{-1}$$
$$(T_{3,1}(W^{-1})_{1,1}+T_{3,2}(W^{-1})_{2,1})=(W^{-1})_{1,1}+(W^{-1})_{1,1}$$
$$T_{1,3}T_{3,3}^{-1}T_{3,1}(W^{-1})_{1,1}+(W^{-1})_{1,1}T_{1,3}T_{3,3}^{-1}T_{3,2}$$
$$(W^{-1})_{2,1}+(W^{-1})_{1,2}T_{2,3}T_{3,3}^{-1}T_{3,1}(W^{-1})_{1,1}+$$
$$(W^{-1})_{1,2}T_{2,3}T_{3,3}^{-1}T_{3,2}(W^{-1})_{2,1}=(A_{1,1}^{-1}\otimes$$
$$(B_{1,1}^{-1})+(A_{1,1}^{-1}A_{1,2}A_{2,2}^{-1}A_{2,1}A_{1,1}^{-1})\otimes(B_{1,1}^{-1}$$
$$B_{1,2}B_{2,2}^{-1}B_{2,1}B_{1,1}^{-1})+(A_{1,1}^{-1})\otimes(B_{1,1}^{-1})+$$
$$(A_{1,1}^{-1}A_{1,2}A_{2,2}^{-1}A_{2,1}A_{1,1}^{-1})\otimes(B_{1,1}^{-1}B_{1,2}$$
$$B_{2,2}^{-1}B_{2,1}B_{1,1}^{-1})+(A_{1,1}^{-1}A_{1,3}A_{3,3}^{-1}A_{3,1}A_{1,1}^{-1})\otimes$$
$$(B_{1,1}^{-1}B_{1,3}B_{3,3}^{-1}B_{3,1}B_{1,1}^{-1})+(A_{1,1}^{-1}A_{1,3}A_{3,3}^{-1}$$
$$A_{3,1}A_{1,1}^{-1}A_{1,2}A_{2,2}^{-1}A_{2,1}A_{1,1}^{-1})\otimes(B_{1,1}^{-1}B_{1,3}$$
$$B_{3,3}^{-1}B_{3,1}B_{1,1}^{-1}B_{1,2}B_{2,2}^{-1}B_{2,1}B_{1,1}^{-1})+(A_{1,1}^{-1}$$
$$A_{1,2}A_{2,2}^{-1}A_{2,1}A_{1,1}^{-1}A_{1,3}A_{3,3}^{-1}A_{3,1}A_{1,1}^{-1})\otimes$$
$$(B_{1,1}^{-1}B_{1,2}B_{2,2}^{-1}B_{2,1}B_{1,1}^{-1}B_{1,3}B_{3,3}^{-1}B_{3,1}B_{1,1}^{-1})+$$
$$(A_{1,1}^{-1}A_{1,2}A_{2,2}^{-1}A_{2,1}A_{1,1}^{-1}A_{1,3}A_{3,3}^{-1}A_{3,1}$$
$$A_{1,1}^{-1}A_{1,2}A_{2,2}^{-1}A_{2,1}A_{1,1}^{-1})\otimes(B_{1,1}^{-1}B_{1,2}B_{2,2}^{-1}$$
$$B_{2,1}B_{1,1}^{-1}B_{1,3}B_{3,3}^{-1}B_{3,1}B_{1,1}^{-1}B_{1,2}B_{2,2}^{-1}B_{2,1}$$
$$B_{1,1}^{-1})+(-A_{1,1}^{-1}A_{1,3}A_{3,3}^{-1}A_{3,2}A_{2,2}^{-1}A_{2,1}A_{1,1}^{-1})\otimes$$
$$(B_{1,1}^{-1}B_{1,3}B_{3,3}^{-1}B_{3,2}B_{2,2}^{-1}B_{2,1}B_{1,1}^{-1})+$$
$$(-A_{1,1}^{-1}A_{1,2}A_{2,2}^{-1}A_{2,1}A_{1,1}^{-1}A_{1,3}A_{3,3}^{-1}A_{3,2}$$
$$A_{2,2}^{-1}A_{2,1}A_{1,1}^{-1})\otimes(B_{1,1}^{-1}B_{1,2}B_{2,2}^{-1}B_{2,1}B_{1,1}^{-1}$$
$$B_{1,3}B_{3,3}^{-1}B_{3,2}B_{2,2}^{-1}B_{2,1}B_{1,1}^{-1})+(A_{1,1}^{-1}A_{1,2}$$
$$A_{2,2}^{-1}A_{2,1}A_{3,3}^{-1}A_{3,1}A_{1,1}^{-1})\otimes(B_{1,1}^{-1}B_{1,2}B_{2,2}^{-1}$$
$$B_{2,3}B_{3,3}^{-1}B_{3,1}B_{1,1}^{-1})+(A_{1,1}^{-1}A_{1,2}A_{2,2}^{-1}A_{2,3}$$
$$A_{3,3}^{-1}A_{3,1}A_{1,1}^{-1}A_{1,2}A_{2,2}^{-1}A_{2,1}A_{1,1}^{-1})\otimes(B_{1,1}^{-1}$$
$$B_{1,2}B_{2,2}^{-1}B_{2,3}B_{3,3}^{-1}B_{3,1}B_{1,1}^{-1}B_{1,2}B_{2,2}^{-1}B_{2,1}$$
$$B_{1,1}^{-1})+(-A_{1,1}^{-1}A_{1,2}A_{2,2}^{-1}A_{2,3}A_{3,3}^{-1}A_{3,2}A_{2,2}^{-1}$$
$$A_{2,1}A_{1,1}^{-1})\otimes(B_{1,1}^{-1}B_{1,2}B_{2,2}^{-1}B_{2,3}B_{3,3}^{-1}B_{3,2}$$
$$B_{2,2}^{-1}B_{2,1}B_{1,1}^{-1})$$

$$(K^{-1})_{1,2}=(W^{-1})_{1,2}((W^{-1})_{1,1}T_{1,3}+(W^{-1})_{1,2}T_{2,3})T_{3,3}^{-1}$$
$$(T_{3,1}(W^{-1})_{1,2}+T_{3,2}(W^{-1})_{2,2})=(W^{-1})_{1,2}+(W^{-1})_{1,1}$$
$$T_{1,3}T_{3,3}^{-1}T_{3,1}(W^{-1})_{1,2}+(W^{-1})_{1,1}T_{1,3}T_{3,3}^{-1}T_{3,2}$$
$$(W^{-1})_{2,2}+(W^{-1})_{1,2}T_{2,3}T_{3,3}^{-1}T_{3,1}(W^{-1})_{1,2}+$$
$$(W^{-1})_{1,2}T_{2,3}T_{3,3}^{-1}T_{3,2}(W^{-1})_{2,2}=(A_{1,1}^{-1}A_{1,2}A_{2,2}^{-1})$$
$$\otimes(B_{1,1}^{-1}B_{1,2}B_{2,2}^{-1})+(A_{1,1}^{-1}A_{1,3}A_{3,3}^{-1}A_{3,1}$$
$$A_{1,1}^{-1}A_{1,2}A_{2,2}^{-1})\otimes(B_{1,1}^{-1}B_{1,3}B_{3,3}^{-1}B_{3,1}B_{1,1}^{-1}$$
$$B_{1,2}B_{2,2}^{-1})+(A_{1,1}^{-1}A_{1,2}A_{2,2}^{-1}A_{2,1}A_{1,1}^{-1}A_{1,3}$$
$$A_{3,3}^{-1}A_{3,1}A_{1,1}^{-1}A_{1,2}A_{2,2}^{-1})\otimes(B_{1,1}^{-1}B_{1,2}B_{2,2}^{-1}$$
$$B_{2,1}B_{1,1}^{-1}B_{1,3}B_{3,3}^{-1}B_{3,1}B_{1,1}^{-1}B_{1,2}B_{2,2}^{-1})+$$
$$(A_{1,1}^{-1}A_{1,3}A_{3,3}^{-1}A_{3,2}A_{2,2}^{-1})\otimes(B_{1,1}^{-1}B_{1,3}$$
$$B_{3,3}^{-1}B_{3,2}B_{2,2}^{-1})+(A_{1,1}^{-1}A_{1,2}A_{2,2}^{-1}A_{2,1}A_{1,1}^{-1}$$
$$A_{1,3}A_{3,3}^{-1}A_{3,2}A_{2,2}^{-1})\otimes(B_{1,1}^{-1}B_{1,2}B_{2,2}^{-1}B_{2,1}$$
$$B_{1,1}^{-1}B_{1,3}B_{3,3}^{-1}B_{3,2}B_{2,2}^{-1})+(A_{1,1}^{-1}A_{1,2}A_{2,2}^{-1}$$
$$A_{2,3}A_{3,3}^{-1}A_{3,1}A_{1,1}^{-1}A_{1,2}A_{2,2}^{-1})\otimes(B_{1,1}^{-1}B_{1,2}$$
$$B_{2,2}^{-1}B_{2,3}B_{3,3}^{-1}B_{3,1}B_{1,1}^{-1}B_{1,2}B_{2,2}^{-1})+(-A_{1,1}^{-1}$$
$$A_{1,2}A_{2,2}^{-1}A_{2,3}A_{3,3}^{-1}A_{3,2}A_{2,2}^{-1})\otimes(A_{1,1}^{-1}A_{1,2}$$
$$A_{2,2}^{-1}A_{2,3}A_{3,3}^{-1}A_{3,2}A_{2,2}^{-1})+(-A_{1,1}^{-1}A_{1,2}A_{2,2}^{-1}$$
$$A_{2,3}A_{3,3}^{-1}A_{3,2}A_{2,2}^{-1})\otimes(B_{1,1}^{-1}B_{1,2}B_{2,2}^{-1}B_{2,3}$$
$$B_{3,3}^{-1}B_{3,2}B_{2,2}^{-1})$$

$$(K^{-1})_{1,3}=(W^{-1})_{1,1}T_{1,3}+(W^{-1})_{1,2}T_{2,3})T_{3,3}^{-1}=(A_{1,1}^{-1}$$
$$A_{1,3}A_{3,3}^{-1})\otimes(B_{1,1}^{-1}B_{1,3}B_{3,3}^{-1})+(A_{1,1}^{-1}A_{1,2}$$
$$A_{2,2}^{-1}A_{2,1}A_{1,1}^{-1}A_{1,3}A_{3,3}^{-1})\otimes(B_{1,1}^{-1}B_{1,2}B_{2,2}^{-1}$$
$$B_{2,1}B_{1,1}^{-1}B_{1,3}B_{3,3}^{-1})+(A_{1,1}^{-1}A_{1,2}A_{2,2}^{-1}A_{2,3}$$
$$A_{3,3}^{-1})\otimes(B_{1,1}^{-1}B_{1,2}B_{2,2}^{-1}B_{2,3}B_{3,3}^{-1}),$$

$$(K^{-1})_{2,1}=(W^{-1})_{2,1}+((W^{-1})_{2,1}T_{1,3}+(W^{-1})_{2,2}T_{2,3})T_{3,3}^{-1}$$
$$(T_{3,1}(W^{-1})_{1,1}+T_{3,2}(W^{-1})_{2,1})=(W^{-1})_{2,1}+(W^{-1})_{2,1}$$
$$T_{1,3}T_{3,3}^{-1}T_{3,1}(W^{-1})_{1,1}+(W^{-1})_{2,1}T_{1,3}T_{3,3}^{-1}T_{3,2}$$
$$(W^{-1})_{2,1}+(W^{-1})_{2,2}T_{2,3}T_{3,3}^{-1}T_{3,1}(W^{-1})_{1,1}+$$
$$(W^{-1})_{2,2}T_{2,3}T_{3,3}^{-1}T_{3,2}(W^{-1})_{2,1}=(A_{2,2}^{-1}A_{2,1}A_{1,1}^{-1})$$
$$\otimes(B_{2,2}^{-1}B_{2,1}B_{1,1}^{-1})+(A_{2,2}^{-1}A_{2,1}A_{1,1}^{-1}A_{1,3}$$
$$A_{3,3}^{-1}A_{3,1}A_{1,1}^{-1})\otimes(B_{2,2}^{-1}B_{2,1}B_{1,1}^{-1}B_{1,3}B_{3,3}^{-1}$$
$$B_{3,1}B_{1,1}^{-1})+(-A_{2,2}^{-1}A_{2,1}A_{1,1}^{-1}A_{1,3}A_{3,3}^{-1}A_{3,1}$$
$$A_{1,1}^{-1}A_{1,2}A_{2,2}^{-1}A_{2,1}A_{1,1}^{-1})\otimes(B_{2,2}^{-1}B_{2,1}B_{1,1}^{-1}$$
$$B_{1,3}B_{3,3}^{-1}B_{3,1}B_{1,1}^{-1}B_{1,2}B_{2,2}^{-1}B_{2,1}B_{1,1}^{-1})+$$
$$(A_{2,2}^{-1}A_{2,1}A_{1,1}^{-1}A_{1,3}A_{3,3}^{-1}A_{3,2}A_{2,2}^{-1}A_{2,1}A_{1,1}^{-1})$$
$$\otimes(B_{2,2}^{-1}B_{2,1}B_{1,1}^{-1}B_{1,3}B_{3,3}^{-1}B_{3,2}B_{2,2}^{-1}B_{2,1}$$
$$B_{1,1}^{-1})+(A_{2,2}^{-1}A_{2,3}A_{3,3}^{-1}A_{3,1}A_{1,1}^{-1})\otimes(B_{2,2}^{-1}$$
$$B_{2,3}B_{3,3}^{-1}B_{3,1}B_{1,1}^{-1})+(A_{2,2}^{-1}A_{2,3}A_{3,3}^{-1}A_{3,1}$$
$$A_{1,1}^{-1}A_{1,2}A_{2,2}^{-1}A_{2,1}A_{1,1}^{-1})\otimes(B_{2,2}^{-1}B_{2,3}B_{3,3}^{-1}$$
$$B_{3,1}B_{1,1}^{-1}B_{1,2}B_{2,2}^{-1}B_{2,1}B_{1,1}^{-1})+(-A_{2,2}^{-1}A_{2,3}$$
$$A_{3,3}^{-1}A_{3,2}A_{2,2}^{-1}A_{2,1}A_{1,1}^{-1})\otimes(B_{2,2}^{-1}B_{2,3}B_{3,3}^{-1}$$
$$B_{3,2}B_{2,2}^{-1}B_{2,1}B_{1,1}^{-1})$$

$$(K^{-1})_{2,2}=(W^{-1})_{2,2}+((W^{-1})_{2,1}T_{1,3}+(W^{-1})_{2,2}T_{2,3})T_{3,3}^{-1}$$
$$(T_{3,1}(W^{-1})_{1,2}+T_{3,2}(W^{-1})_{2,2})=(W^{-1})_{2,2}+(W^{-1})_{2,1}$$
$$T_{1,3}T_{3,3}^{-1}T_{3,1}(W^{-1})_{1,2}+(W^{-1})_{2,1}T_{1,3}T_{3,3}^{-1}T_{3,2}$$
$$(W^{-1})_{2,2}+(W^{-1})_{2,2}T_{2,3}T_{3,3}^{-1}T_{3,1}(W^{-1})_{1,2}+$$
$$(W^{-1})_{2,2}T_{2,3}T_{3,3}^{-1}T_{3,2}(W^{-1})_{2,2}=A_{2,2}^{-1}\otimes B_{2,2}^{-1}+(-$$
$$A_{2,2}^{-1}A_{2,1}A_{1,1}^{-1}A_{1,3}A_{3,3}^{-1}A_{3,1}A_{1,1}^{-1}A_{1,2}A_{2,2}^{-1})\otimes$$
$$(B_{2,2}^{-1}B_{2,1}B_{1,1}^{-1}B_{1,3}B_{3,3}^{-1}B_{3,1}B_{1,1}^{-1}B_{1,2}B_{2,2}^{-1})+$$
$$(-A_{2,2}^{-1}A_{2,1}A_{1,1}^{-1}A_{1,3}A_{3,3}^{-1}A_{3,2}A_{2,2}^{-1})\otimes$$
$$(B_{2,2}^{-1}B_{2,1}B_{1,1}^{-1}B_{1,3}B_{3,3}^{-1}B_{3,2}B_{2,2}^{-1})+$$
$$(A_{2,2}^{-1}A_{2,3}A_{3,3}^{-1}A_{3,1}A_{1,1}^{-1}A_{1,2}A_{2,2}^{-1})\otimes$$
$$(B_{2,2}^{-1}B_{2,3}B_{3,3}^{-1}B_{3,1}B_{1,1}^{-1}B_{1,2}B_{2,2}^{-1})+(A_{2,2}^{-1}$$
$$A_{2,3}A_{3,3}^{-1}A_{3,2}A_{2,2}^{-1})\otimes(B_{2,2}^{-1}B_{2,3}B_{3,3}^{-1}B_{3,2}$$
$$B_{2,2}^{-1}),$$

$(K^{-1})_{2,3}=((W^{-1})_{1,1}T_{1,3}+(W^{-1})_{1,2}T_{2,3})T_{3,3}^{-1}=$
$(A_{1,1}^{-1}A_{1,3}A_{3,3}^{-1})\otimes(B_{1,1}^{-1}B_{1,3}B_{3,3}^{-1})+$
$(A_{1,1}^{-1}A_{1,2}A_{2,2}^{-1}A_{2,1}A_{1,1}^{-1}A_{1,3}A_{3,3}^{-1})\otimes$
$(B_{1,1}^{-1}B_{1,2}B_{2,2}^{-1}B_{2,1}B_{1,1}^{-1}B_{1,3}B_{3,3}^{-1})+$
$(A_{1,1}^{-1}A_{1,2}A_{2,2}^{-1}A_{2,3}A_{3,3}^{-1})\otimes(B_{1,1}^{-1}B_{1,2}B_{2,2}^{-1}B_{2,3}B_{3,3}^{-1})$ $(K^{-1})_{3,1}=-T_{3,3}^{-1}(T_{3,1}(W^{-1})_{1,1}+T_{3,2}(W^{-1})_{1,1})=$
$(-A_{3,3}^{-1}A_{3,1}A_{1,1}^{-1})\otimes(B_{3,3}^{-1}B_{3,1}B_{1,1}^{-1})+$
$(-A_{3,3}^{-1}A_{3,1}A_{1,1}^{-1}A_{1,2}A_{2,2}^{-1}A_{2,1}A_{1,1}^{-1})\otimes$
$(B_{3,3}^{-1}B_{3,1}B_{1,1}^{-1}B_{1,2}B_{2,2}^{-1}B_{2,1}B_{1,1}^{-1})+(A_{3,3}^{-1}A_{3,2}A_{2,2}^{-1}A_{2,1}A_{1,1}^{-1})\otimes(B_{3,3}^{-1}B_{3,2}B_{2,2}^{-1}B_{2,1}B_{1,1}^{-1})$, $(K^{-1})_{3,2}=-T_{3,3}^{-1}(T_{3,1}(W^{-1})_{1,2}+T_{3,2}(W^{-1})_{2,2})=$
$(-A_{3,3}^{-1}A_{3,1}A_{1,1}^{-1}A_{1,2}A_{2,2}^{-1})\otimes(B_{3,3}^{-1}B_{3,1}B_{1,1}^{-1}B_{1,2}B_{2,2}^{-1})+(-A_{3,3}^{-1}A_{3,2}A_{2,2}^{-1})\otimes(B_{3,3}^{-1}B_{3,2}B_{2,2}^{-1})$, $(K^{-1})_{3,3}=A_{3,3}^{-1}\otimes B_{3,3}^{-1}$ Multiple Terms Approximation
Sum Approximation This section describes the elements of $K^{-1}$, if the sum approximation described in the corresponding Section above is used, where each BTTB matrix has been approximated via an approximate SVD.

$(K^{-1})_{1,1}=(W^{-1})_{1,2}+(W^{-1})_{1,1}T_{1,3}T_{3,3}^{-1}T_{3,1}(W^{-1})_{1,2}+$
$(W^{-1})_{1,1}T_{1,3}T_{3,3}^{-1}T_{3,2}(W^{-1})_{2,2}+(W^{-1})_{1,2}T_{2,3}$
$T_{3,3}^{-1}T_{3,1}(W^{-1})_{1,2}+(W^{-1})_{1,2}T_{2,3}T_{3,3}^{-1}T_{3,2}$
$(W^{-1})_{2,2}=V_{11}S_{11}^{-1}U_{11}^H+V_{11}$
$S_{11}^{-1}U_{11}^HU_{12}S_{12}V_{12}^HV_{22}$
$S_{22}^{-1}U_{22}^HU_{21}S_{21}V_{21}^HV_{11}S_{11}^{-1}U_{11}^H+V_{11}$
$S_{11}^{-1}U_{11}^HU_{13}S_{13}V_{13}^HV_{33}$
$S_{33}^{-1}U_{33}^HU_{31}S_{31}V_{31}^HV_{11}S_{11}^{-1}U_{11}^H+V_{11}$
$S_{11}^{-1}U_{11}^HU_{13}S_{13}V_{13}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}$
$S_{22}^{-1}U_{22}^HU_{21}S_{21}V_{21}^HV_{11}S_{11}^{-1}U_{11}^H+V_{11}$
$S_{11}^{-1}U_{11}^HU_{12}S_{12}V_{12}^HV_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}S_{11}^{-1}U_{11}^H+V_{11}$
$S_{11}^{-1}U_{11}^HU_{12}S_{12}V_{12}^HV_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}S_{11}^{-1}U_{11}^H-V_{11}$
$S_{11}^{-1}U_{11}^HU_{13}S_{13}V_{13}^HV_{33}$
$S_{33}^{-1}U_{33}^HU_{32}S_{32}V_{32}^HV_{22}$
$S_{22}^{-1}U_{22}^HU_{21}S_{21}V_{21}^HV_{11}S_{11}^{-1}U_{11}^H-V_{11}$
$S_{11}^{-1}U_{11}^HU_{12}S_{12}V_{12}^HV_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{32}S_{32}V_{32}^HV_{22}$
$S_{22}^{-1}U_{22}^HU_{21}S_{21}V_{21}^HV_{11}S_{11}^{-1}U_{11}^H+V_{11}$
$S_{11}^{-1}U_{11}^HU_{12}S_{12}V_{12}^HV_{22}$
$S_{22}^{-1}U_{22}^HU_{23}S_{23}V_{23}^HV_{33}$
$S_{33}^{-1}U_{33}^HU_{31}S_{31}V_{31}^HV_{11}S_{11}^{-1}U_{11}^H+V_{11}$
$S_{11}^{-1}U_{11}^HU_{12}S_{12}V_{12}^HV_{22}$
$S_{22}^{-1}U_{22}^HU_{23}S_{23}V_{23}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}$
$S_{22}^{-1}U_{22}^HU_{21}S_{21}V_{21}^HV_{11}S_{11}^{-1}U_{11}^H-V_{11}$
$S_{11}^{-1}U_{11}^HU_{12}S_{12}V_{12}^HV_{22}$
$S_{22}^{-1}U_{22}^HU_{23}S_{23}V_{23}^HV_{33}$
$S_{33}^{-1}U_{33}^HU_{32}S_{32}V_{32}^HV_{22}$
$S_{22}^{-1}U_{22}^HU_{21}S_{21}V_{21}^HV_{11}S_{11}^{-1}U_{11}^H$, $(K^{-1})_{1,2}=(W^{-1})_{1,2}+(W^{-1})_{1,1}T_{1,3}T_{3,3}^{-1}T_{3,1}(W^{-1})_{1,2}+$
$(W^{-1})_{1,1}T_{1,3}T_{3,3}^{-1}T_{3,2}(W^{-1})_{2,2}+(W^{-1})_{1,2}T_{2,3}$
$T_{3,3}^{-1}T_{3,1}(W^{-1})_{1,2}+(W^{-1})_{1,2}T_{2,3}T_{3,3}^{-1}T_{3,2}$
$(W^{-1})_{2,2}=V_{11}S_{11}^{-1}U_{11}^HU_{12}S_{12}V_{12}^HV_{22}$
$S_{22}^{-1}U_{22}^H+V_{11}S_{11}^{-1}U_{11}^HU_{13}S_{13}V_{13}^HV_{33}$
$S_{33}^{-1}U_{33}^HU_{31}S_{31}V_{31}^H+V_{11}$
$S_{11}^{-1}U_{11}^HU_{12}S_{12}V_{12}^HV_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}S_{22}^{-1}U_{22}^H+V_{11}$
$S_{11}^{-1}U_{11}^HU_{13}S_{13}V_{13}^HV_{33}$ $S_{33}^{-1}U_{33}^HU_{32}S_{32}V_{32}^HV_{22}S_{22}^{-1}U_{22}^H+V_{11}$
$S_{11}^{-1}U_{11}^HU_{12}S_{12}V_{12}^HV_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{32}S_{32}V_{32}^HV_{22}S_{22}^{-1}U_{22}^H+V_{11}$
$S_{11}^{-1}U_{11}^HU_{12}S_{12}V_{12}^HV_{22}$
$S_{22}^{-1}U_{22}^HU_{23}S_{23}V_{23}^HV_{33}S_{33}^{-1}U_{33}^HV_{33}$
$S_{33}^{-1}U_{33}^HU_{32}S_{32}V_{32}^HV_{22}S_{22}^{-1}U_{22}^H+V_{11}$
$S_{11}^{-1}U_{11}^HU_{12}S_{12}V_{12}^HV_{22}$
$S_{22}^{-1}U_{22}^HU_{23}S_{23}V_{23}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}S_{22}^{-1}U_{22}^H+V_{11}$
$S_{11}^{-1}U_{11}^HU_{12}S_{12}V_{12}^HV_{22}$
$S_{22}^{-1}U_{22}^HU_{23}S_{23}V_{23}^HV_{33}$
$S_{33}^{-1}U_{33}^HU_{32}S_{32}V_{32}^HV_{22}S_{22}^{-1}U_{22}^H$, $(K^{-1})_{1,3}=((W^{-1})_{1,1}T_{1,3}+(W^{-1})_{1,2}T_{2,3})T_{3,3}^{-1}=V_{11}$
$S_{11}^{-1}U_{11}^HU_{13}S_{13}V_{13}^HV_{33}S_{33}^{-1}U_{33}^H+V_{11}$
$S_{11}^{-1}U_{11}^HU_{12}S_{12}V_{12}^HV_{22}$
$S_{22}^{-1}U_{22}^HU_{21}S_{21}V_{21}^HV_{11}$
$S_{11}^{-1}U_{11}^HU_{13}S_{13}V_{13}^HV_{33}S_{33}^{-1}U_{33}^H+V_{22}$
$S_{22}^{-1}U_{22}^HU_{23}S_{23}V_{23}^HV_{33}S_{33}^{-1}U_{33}^H$, $(K^{-1})_{2,1}=(W^{-1})_{2,1}+(W^{-1})_{2,1}T_{1,3}T_{3,3}^{-1}T_{3,1}(W^{-1})_{1,1}+$
$(W^{-1})_{2,1}T_{1,3}T_{3,3}^{-1}T_{3,2}(W^{-1})_{2,1}+(W^{-1})_{2,2}T_{2,3}$
$T_{3,3}^{-1}T_{3,1}(W^{-1})_{1,1}+(W^{-1})_{2,2}T_{2,3}T_{3,3}^{-1}T_{3,2}$
$(W^{-1})_{2,1}=-V_{22}S_{22}^{-1}U_{22}^HU_{21}S_{21}V_{21}^HV_{11}$
$S_{11}^{-1}U_{11}^H-V_{22}S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}S_{11}^{-1}U_{11}^H-V_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}$
$S_{22}^{-1}U_{22}^HU_{21}S_{21}V_{21}^HV_{11}S_{11}^{-1}U_{11}^H+V_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}$
$S_{22}^{-1}U_{22}^HU_{21}S_{21}V_{21}^HV_{11}S_{11}^{-1}U_{11}^H+V_{22}$
$S_{22}^{-1}U_{22}^HU_{23}S_{23}V_{23}^HV_{33}$
$S_{33}^{-1}U_{33}^HU_{31}S_{31}V_{31}^HV_{11}S_{11}^{-1}U_{11}^H+V_{22}$
$S_{22}^{-1}U_{22}^HU_{23}S_{23}V_{23}^HV_{33}$
$S_{33}^{-1}U_{33}^HU_{31}S_{31}V_{31}^HV_{11}S_{11}^{-1}$
$U_{hu}{}_HU_{12}S_{12}V_{12}^HV_{22}S_{22}^{-1}U_{22}^HU_{21}S_{21}V_{21}^HV_{11}$
$S_{11}^{-1}U_{11}^H-V_{22}S_{22}^{-1}U_{22}^HU_{23}S_{23}V_{23}^HV_{33}$
$S_{33}^{-1}U_{33}^HU_{32}S_{32}V_{32}^HV_{22}$
$S_{22}^{-1}U_{22}^HU_{21}S_{21}V_{21}^HV_{11}S_{11}^{-1}U_{11}^H$, $(K^{-1})_{1,2}=(W^{-1})_{2,2}+(W^{-1})_{2,1}T_{1,3}T_{3,3}^{-1}T_{3,1}(W^{-1})_{1,2}+$
$(W^{-1})_{1,1}T_{1,3}T_{3,3}^{-1}T_{3,2}(W^{-1})_{2,2}+(W^{-1})_{2,2}T_{2,3}$
$T_{3,3}^{-1}T_{3,1}(W^{-1})_{1,2}+(W^{-1})_{2,2}T_{2,3}T_{3,3}^{-1}T_{3,2}$
$(W^{-1})_{2,2}=V_{22}S_{22}^{-1}U_{22}^H-V_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}S_{22}^{-1}U_{22}^H-V_{22}$
$S_{22}^{-1}U_{22}^HU_{21}S_{21}V_{21}^HV_{11}$
$S_{11}^{-1}U_{11}^HU_{13}S_{13}V_{13}^HV_{33}$
$S_{33}^{-1}U_{33}^HU_{32}S_{32}V_{32}^HV_{22}S_{22}^{-1}U_{22}^H+V_{22}$
$S_{22}^{-1}U_{22}^HU_{23}S_{23}V_{23}^HV_{33}$
$S_{33}^{-1}U_{33}^HU_{31}S_{31}V_{31}^HV_{11}$
$S_{11}^{-1}U_{11}^HU_{12}S_{12}V_{12}^HV_{22}S_{22}^{-1}U_{22}^H+V_{22}$
$S_{22}^{-1}U_{22}^HU_{23}S_{23}V_{23}^HV_{33}$
$S_{33}^{-1}U_{33}^HU_{32}S_{32}V_{32}^HV_{22}S_{22}^{-1}U_{22}^H$, $(K^{-1})_{2,3}=((W^{-1})_{2,1}T_{1,3}+(W^{-1})_{2,2}T_{2,3})T_{3,3}=-V_{22}$
$S_{22}^{-1}U_{22}^HU_{21}S_{21}V_{21}^HV_{11}$
$S_{11}^{-1}U_{11}^HU_{13}S_{13}V_{13}^HV_{33}S_{33}^{-1}U_{33}^H+V_{22}$
$S_{22}^{-1}U_{22}^HU_{23}S_{23}V_{23}^HV_{33}S_{33}^{-1}U_{33}^H$, $(K^{-1})_{3,1}=-T_{3,3}^{-1}(T_{3,1}(W^{-1})_{1,1}+T_{3,2}(W^{-1})_{2,1})=-V_{33}$
$S_{33}^{-1}U_{33}^HU_{31}S_{31}V_{31}^HV_{11}S_{11}^{-1}U_{11}^H-V_{33}$
$S_{33}^{-1}U_{33}^HU_{31}S_{31}V_{31}^HV_{11}$
$S_{11}^{-1}U_{11}^HU_{12}S_{12}V_{12}^HV_{22}$
$S_{22}^{-1}U_{22}^HU_{21}S_{21}V_{21}^HV_{11}S_{11}^{-1}U_{11}^H+V_{33}$
$S_{33}^{-1}U_{33}^HU_{32}S_{32}V_{32}^HV_{22}$
$S_{22}^{-1}U_{22}^HU_{21}S_{21}V_{21}^HV_{11}S_{11}^{-1}U_{11}^H$, $$(K^{-1})_{3,2} = T_{3,3}^{-1}(T_{3,1}(W^{-1})_{1,2} + T_{3,2}(W^{-1})_{2,2}) = -V_{33}$$
$$S_{33}^{-1}U_{33}^H U_{31} S_{31} V_{31}^H V_{11}$$
$$S_{11}^{-1}U_{11}^H U_{12} S_{12} V_{12}^H V_{22} S_{22}^{-1} U_{22}^H - V_{33}$$
$$S_{33}^{-1}U_{33}^H U_{32} S_{32} V_{32}^H V_{22} S_{22}^{-1} U_{22}^H,$$

$$(K^{-1})_{3,3} = U_{33} S_{33} V_{33}^{-H}$$

The invention claimed is:

1. A method for reconstructing a parameter of a lithographic process comprising:
   directing radiation onto a substrate;
   detecting scattered illumination from the substrate using a sensor;
   determining an inverse of a matrix valued generating function to obtain a matrix valued inverse generating function, each element of the matrix valued generating function being a Fourier Series;
   generating a preconditioner for an input system comprising a difference of a first matrix and a second matrix, the first matrix being arranged to have a multi-level structure of at least three levels wherein at least two of the levels comprise a Toeplitz structure and non-zero elements of the first matrix being generated using the matrix valued inverse generating function; and
   determining an object structure based on a result of comparing an electromagnetic scattering property determined based on the detected scattered illumination to at least one model electromagnetic scattering property determined using at least the preconditioner.

2. The method of claim 1, wherein the first matrix relates to material property distribution in a transverse plane of a structure being measured.

3. The method of claim 1, wherein the first matrix links an electric field related to a measurement of the structure with an associated auxiliary vector field.

4. The method of claim 1, wherein the second matrix comprises the product of a Green's function matrix and a contrast matrix representing the contrast between materials in the structure.

5. The method of claim 1, wherein, after permutation, the at least two levels which comprise a Toeplitz structure are the lowermost two levels.

6. The method of claim 1, wherein the first matrix is arranged such that each block of a penultimate level comprises a Block Toeplitz-Toeplitz block (BTTB) structure.

7. The method of claim 6, wherein the first matrix is arranged such that a level above the penultimate level comprises a BTTB-Block structure.

8. The method of claim 7, wherein the BTTB-Block structure comprises a 3×3 BTTB-Block structure.

9. The method of claim 7, wherein the first matrix is arranged such that a top most level of the multi-level structure comprises a Block-Diagonal structure.

10. The method of claim 9, wherein the multi-level matrix structure comprises four levels.

11. The method of claim 10, wherein:
   the preconditioner comprises a Block-Diagonal matrix, and
   each non-zero element comprises a Toeplitz-Block structure.

12. The method of claim 1, further comprising:
   numerically solving a volume integral equation for electromagnetic scattering for a plurality of modes in at least one lateral direction, wherein integration is performed by solving a linear system of equations, each of which comprises a term based on the input system and each preconditioned by the preconditioner; and
   calculating electromagnetic scattering properties of a structure defined in part by the parameter using results of the numerical solution.

13. The method of claim 12, wherein the first matrix comprises a normal vector field matrix decomposed from a coefficient matrix of the linear system of equations.

14. A method of reconstructing an approximate structure of an object from a detected electromagnetic scattering property arising from illumination of the object by radiation, the method comprising:
   directing radiation onto a substrate;
   detecting scattered illumination from the substrate using a sensor;
   determining the detected electromagnetic scattering property based on the scattered illumination;
   estimating a parameter of the structure;
   determining at least one model electromagnetic scattering property from the parameter;
   comparing the detected electromagnetic scattering property to the at least one model electromagnetic scattering property; and
   determining an approximate object structure based on the result of the comparison,
   wherein the model electromagnetic scattering property is determined using a method comprising:
      determining an inverse of a matrix valued generating function to obtain a matrix valued inverse generating function, each element of the matrix valued generating function being a Fourier Series,
      generating a preconditioner for an input system comprising a difference of a first matrix and a second matrix, the first matrix being arranged to have a multi-level structure of at least three levels wherein at least two of the levels comprise a Toeplitz structure and non-zero elements of the first matrix being generated using the matrix valued inverse generating function,
      numerically solving a volume integral equation for electromagnetic scattering for a plurality of modes in at least one lateral direction, wherein integration is performed by solving a linear system of equations, each of which comprises a term based on the input system and each preconditioned by the preconditioner; and
      calculating electromagnetic scattering properties of a structure defined in part by the parameter using results of the numerical solution.

15. The method according to claim 14, further comprising:
   arranging a plurality of the model electromagnetic scattering properties in a library; and
   comparing comprises matching the detected electromagnetic scattering property to contents of the library.

16. The method according to claim 14, further comprising iterating the determining at least one model electromagnetic scattering property and comparing the detected electromagnetic scattering property,
   wherein the parameter is revised based on the result of the comparing in a previous iteration.

17. A computer program product containing one or more sequences of machine-readable instructions for reconstructing a parameter, the instructions being adapted to cause one or more processors to perform a method comprising:
   reconstructing a parameter of a lithographic process by generating a preconditioner for an input system comprising a difference of a first matrix and a second matrix, and determining an object structure based on a result of comparing an electromagnetic scattering property determined based on detected scattered illumination to at least one model electromagnetic scattering property determined using at least the preconditioner, wherein the first matrix is arranged to have a multi-level structure of at least three levels, wherein at least two of the levels comprise a Toeplitz structure, wherein non-zero elements of the first matrix being generated using a matrix valued inverse generating function, and wherein the matrix valued inverse generating function is obtained by determining an inverse of a matrix valued generating function, each element of the matrix valued generating function being a Fourier Series.

18. A computer program product containing one or more sequences of machine-readable instructions for calculating electromagnetic scattering properties of a structure, the instructions being adapted to cause one or more processors to perform a method comprising:

determining an object structure based on a result of comparing an electromagnetic scattering property determined based on detected scattered illumination to at least one model electromagnetic scattering property determined using at least the preconditioner; and reconstructing a parameter of a lithographic process by generating a preconditioner suitable for an input system comprising a difference of a first matrix and a second matrix, the first matrix being arranged to have a multi-level structure of at least three levels whereby at least two of the levels comprise a Toeplitz structure, wherein non-zero elements of the first matrix being generated using a matrix valued inverse generating function, and wherein the matrix valued inverse generating function is obtained by determining an inverse of a matrix valued generating function, each element of the matrix valued generating function being a Fourier Series.

19. An inspection apparatus for reconstructing an approximate structure of an object, the inspection apparatus comprising:

an illumination system configured to illuminate the object with radiation;

a detection system configured to detect an electromagnetic scattering property arising from the illumination; and a processor configured to reconstruct a parameter of the structure by reconstructing a parameter of a lithographic process through designing a preconditioner suitable for an input system comprising a difference of a first matrix and a second matrix, the first matrix being arranged to have a multi-level structure of at least three levels whereby at least two of the levels comprise a Toeplitz structure, wherein non-zero elements of the first matrix being generated using a matrix valued inverse generating function, and wherein the matrix valued inverse generating function is obtained by determining an inverse of a matrix valued generating function, each element of the matrix valued generating function being a Fourier Series.

20. The inspection apparatus as claimed in claim 19, wherein the processor is further configured to:

estimate the parameter;

determine at least one model electromagnetic scattering property from the parameter;

compare the detected electromagnetic scattering property to the at least one model electromagnetic scattering property; and determine an approximate object structure from a difference between the detected electromagnetic scattering property and the at least one model electromagnetic scattering property, wherein the processor is configured to determine the model electromagnetic scattering property by:

numerically solving a volume integral equation for electromagnetic scattering for a plurality of modes in at least one lateral direction, wherein integration is performed by solving a linear system of equations, each of which comprises a term based on the input system and each preconditioned by the preconditioner; and calculating electromagnetic scattering properties of a structure defined in part by the parameter using results of the numerical solution.

* * * * *